United States Patent
Hidaka

(10) Patent No.: US 8,599,387 B2
(45) Date of Patent: Dec. 3, 2013

(54) SURFACE POSITION DETECTING APPARATUS, EXPOSURE APPARATUS, AND DEVICE MANUFACTURING METHOD

(75) Inventor: Yasuhiro Hidaka, Kumagaya (JP)

(73) Assignee: Nikon Corporation, Tokyo (JP)

(*) Notice: Subject to any disclaimer, the term of this patent is extended or adjusted under 35 U.S.C. 154(b) by 736 days.

(21) Appl. No.: 12/353,228

(22) Filed: Jan. 13, 2009

(65) Prior Publication Data
US 2009/0208875 A1    Aug. 20, 2009

Related U.S. Application Data

(63) Continuation of application No. PCT/JP2007/063957, filed on Jul. 13, 2007.

(30) Foreign Application Priority Data

Jul. 14, 2006  (JP) ................ P2006-193600

(51) Int. Cl.
*G01B 11/14*    (2006.01)
(52) U.S. Cl.
USPC ........................................ 356/614
(58) Field of Classification Search
USPC .......................... 356/614, 620, 624
See application file for complete search history.

(56) References Cited

U.S. PATENT DOCUMENTS

| | | | |
|---|---|---|---|
| 5,448,332 A * | 9/1995 | Sakakibara et al. | 355/53 |
| 5,587,794 A | 12/1996 | Mizutani et al. | |
| 5,801,835 A * | 9/1998 | Mizutani et al. | 356/614 |
| 6,124,601 A | 9/2000 | Yoshii et al. | |
| 6,124,933 A * | 9/2000 | Mizutani et al. | 356/620 |
| 6,163,369 A * | 12/2000 | Yamada et al. | 355/55 |
| 7,411,667 B2 | 8/2008 | Van Asten et al. | |
| 7,616,327 B2 | 11/2009 | Michelin | |
| 7,751,059 B2 | 7/2010 | Van Asten et al. | |
| 2006/0274324 A1 | 12/2006 | Van Asten et al. | |

(Continued)

FOREIGN PATENT DOCUMENTS

| | | |
|---|---|---|
| JP | 06-104158 | 4/1994 |
| JP | 07-074088 | 3/1995 |

(Continued)

OTHER PUBLICATIONS

Yuichi Shibazaki; "Exposure Apparatus, A Mark Detecting Apparatus, an Exposure Method and a Device Manufacturing Method" U.S. Appl. No. 60/780,049, filed Mar. 8, 2006.

(Continued)

*Primary Examiner* — Roy M Punnoose
(74) *Attorney, Agent, or Firm* — Finnegan, Henderson, Farabow, Garrett & Dunner, L.L.P.

(57) ABSTRACT

A surface position detecting apparatus disclosed herein has a light-sending optical system SL to guide light to a detection target surface, a light-receiving optical system to guide the light to a light-receiving surface, a detector arranged on the light-receiving surface, a splitter to split the light guided to the detection target surface W, into measurement light and reference light on a field basis, and a combiner to combine the measurement light traveling via the detection target surface W toward the light-receiving optical system, with the reference light traveling toward the light-receiving optical system without passing via the detection target surface W, on a field basis; and the detector independently detects the reference light and the measurement light on the light-receiving surface.

15 Claims, 22 Drawing Sheets

(56) References Cited

U.S. PATENT DOCUMENTS

| | | |
|---|---|---|
| 2007/0013915 A1 | 1/2007 | Van Asten et al. |
| 2008/0088843 A1 | 4/2008 | Shibazaki |
| 2008/0309915 A1 | 12/2008 | Van Asten et al. |
| 2009/0141290 A1 | 6/2009 | Michelin |

FOREIGN PATENT DOCUMENTS

| | | | |
|---|---|---|---|
| JP | 09-167737 | | 6/1997 |
| JP | 2000-081320 | | 3/2000 |
| JP | 2000-082654 | | 3/2000 |
| JP | 2000081320 A | * | 3/2000 |
| JP | 2000-121323 | | 4/2000 |
| JP | 2006-337373 | | 12/2006 |
| JP | 2008-533483 | | 8/2008 |

OTHER PUBLICATIONS

Notice of Reasons for Rejection, dated Sep. 9, 2011, in corresponding Japanese Patent Application P2007-181843 (4 pgs).

Notice of Reasons for Rejection, dated Nov. 15, 2011, in corresponding Japanese Patent Application P2007-181843.

Notice of Reasons for Rejection, dated Dec. 7, 2012, in corresponding Japanese Patent Application P2007-181843.

"Method for Correcting Disturbances in a Level Sensor Light Path", English language specification for JP Application No. 2006-155056 (corresponding to Japanese Patent Application Laid-Open No. 2006-3373731, Dec. 14, 2006.

* cited by examiner

B-B SECTION

C-C SECTION

SURFACE POSITION DETECTING APPARATUS, EXPOSURE APPARATUS, AND DEVICE MANUFACTURING METHOD

CROSS-REFERENCE TO RELATED APPLICATIONS

This is a continuation application of a PCT application No. PCT/JP2007/063957 filed on Jul. 13, 2007, claiming the benefit of priorities from Japanese Patent application No. 2006-193600 filed on Jul. 14, 2006, and incorporated by reference in their entirety.

BACKGROUND

1. Field

The present invention relates to a surface position detecting apparatus used in a lithography process for manufacturing semiconductor devices, liquid crystal display devices, and so on, an exposure apparatus incorporating the surface position detecting apparatus, and a device manufacturing method using the exposure apparatus.

2. Description of the Related Art

In a projection exposure apparatus configured to project a pattern on a mask through a projection optical system onto a substrate, the depth of focus of the projection optical system is relatively shallow and a surface of the substrate is uneven in some cases; it is then necessary to accurately adjust the focus position of the projection optical system relative to an exposure region on the substrate.

As a device for detecting the position of the substrate in the direction of the optical axis of the projection optical system, for example, U.S. Pat. No. 5,587,794 discloses an oblique incidence type autofocus sensor (surface position detecting apparatus) configured to project an image of a slit from an oblique direction onto the substrate as a detection target surface and detect the image of the slit from an oblique direction.

Incidentally, the aforementioned oblique incidence type autofocus sensor cannot accurately measure the substrate position in the optical-axis direction of the projection optical system if a measurement error is caused by such factors as disturbance due to an ambient environment, e.g., a temperature distribution in air, and variation in a position of an optical member in the optical system forming the oblique incidence type autofocus sensor. In the conventional technology, this measurement error was measured by means of another measuring system, which required a time for measuring the measurement error and which lowered the throughput of the projection exposure apparatus. If the measuring system for measuring the measurement error was one composed of an optical system different from the oblique incidence type autofocus sensor, there were many error factors based on the difference of the optical system and this posed the problem that the measuring system failed to accurately measure the measurement error.

SUMMARY

An object of the present invention is to provide a surface position detecting apparatus capable of quickly and accurately grasping the measurement error, an exposure apparatus incorporating the surface position detecting apparatus, and a device manufacturing method using the exposure apparatus.

A surface position detecting apparatus according to a first embodiment of the present invention is an apparatus comprising: a light-sending optical system to guide light to a detection target surface; a light-receiving optical system to guide the light to a light-receiving surface; a detector arranged on the light-receiving surface; a splitter which splits the light guided to the detection target surface, into measurement light and reference light on a field basis; and a combiner which combines the measurement light traveling via the detection target surface toward the light-receiving optical system, with the reference light traveling toward the light-receiving optical system without passing via the detection target surface, on a field basis, wherein the detector independently detects the reference light and the measurement light on the light-receiving surface.

Another surface position detecting apparatus according to a second embodiment of the present invention is an apparatus comprising: a light-sending optical system to guide light from a standard object to a detection target surface; a light-receiving optical system to guide the light to a light-receiving surface; a detector arranged on the light-receiving surface; a first optical path deflector which deflects at least one optical path of measurement light and reference light, for guiding the light from a first region of the standard object as the measurement light to a measurement optical path extending via the detection target surface and for guiding the light from a second region of the standard object as the reference light to a reference optical path; and a second optical path deflector to deflect at least one optical path of the measurement light traveling via the detection target surface in the measurement optical path and the reference light traveling in the reference optical path, for guiding the measurement light via the light-receiving optical path to a first region of the light-receiving surface and for guiding the reference light via the light-receiving optical system to a second region of the light-receiving surface, wherein the detector independently detects the measurement light received in the first region of the light-receiving surface and the reference light received in the second region of the light-receiving surface.

An exposure apparatus according to a third embodiment of the present invention is an exposure apparatus to transfer a predetermined pattern on a photosensitive substrate, the exposure apparatus comprising the surface position detecting apparatus of the present invention for detecting a position of a surface of the photosensitive substrate.

A device manufacturing method according to a fourth embodiment of the present invention is a method comprising: a transferring a predetermined pattern onto a photosensitive substrate, using the exposure apparatus of an embodiment of the present invention; and developing the photosensitive substrate on which the predetermined pattern has been transferred in the transferring of the predetermined pattern.

BRIEF DESCRIPTION OF THE DRAWINGS

A general architecture that implements the various features of the invention will now be described with reference to the drawings. The drawings and the associated descriptions are provided to illustrate embodiments of the invention and not to limit the scope of the invention.

FIGS. 19A and 19B are drawings showing a configuration on the wafer surface side of the surface position detecting apparatus according to the modification example, wherein FIG. 19A is a plane view and FIG. 19B is a side view.

FIGS. 20A-20C are drawings showing a configuration of a surface position detecting apparatus according to another modification example, wherein FIG. 20A is a plan view, FIG. 20B a B-B sectional view, and FIG. 20C a C-C sectional view.

DESCRIPTION OF THE EMBODIMENTS

Figure 1:
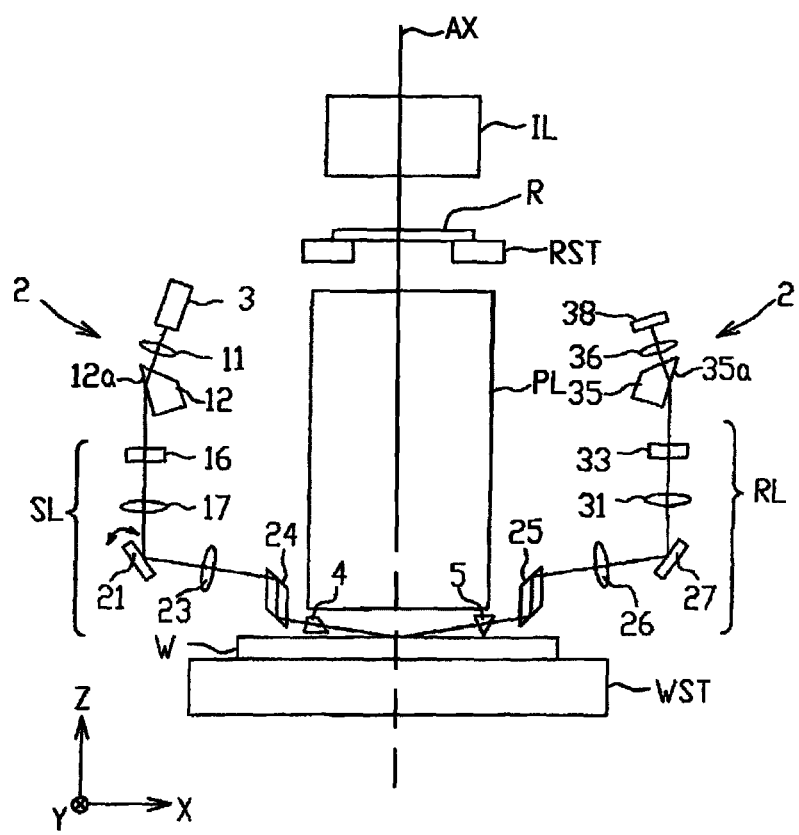
FIG. 1 is a drawing showing a schematic configuration of an exposure apparatus according to the first embodiment.

An exposure apparatus according to the first embodiment of the present invention will be described below with reference to the drawings. FIG. 1 is a drawing showing a schematic configuration of the exposure apparatus according to the first embodiment. In the description hereinafter, an XYZ orthogonal coordinate system is set as shown in FIG. 1 and the positional relationship among members will be explained with reference to this XYZ orthogonal coordinate system. In the XYZ orthogonal coordinate system, the X-axis and the Y-axis are set in parallel with a wafer W and the Z-axis is set along a direction perpendicular to the wafer W. The XYZ coordinate system in the drawings is actually so set that the XY plane is set as a plane parallel to a horizontal plane and that the Z-axis is set along the vertically upward direction.

As shown in FIG. 1, exposure light emitted from an illumination optical system IL including a light source illuminates a reticle R mounted on a reticle stage RST. The position of the reticle stage RST is measured by an unrepresented reticle stage interferometer and subjected to position control. The exposure light passing through an exposure pattern formed on the reticle R travels through a projection optical system PL to project a pattern image of the reticle R onto a wafer W mounted on a wafer stage WST. The wafer stage WST carrying the wafer W is configured so as to be able to translate and finely rotate the wafer W in a plane (XY Plane) perpendicular to the optical axis AX of the projection optical system PL and to move the wafer W in a focusing direction (Z-direction) along the optical axis AX. The position of the wafer stage WST is measured by an unrepresented wafer stage interferometer and subjected to position control. During exposure a liquid such as pure water is supplied to between the wafer W and an optical member (not shown) on the wafer W side forming the projection optical system PL.

This exposure apparatus is equipped with a surface position detecting apparatus 2. This surface position detecting apparatus 2 detects a position of a predetermined detection region on the wafer W in the optical-axis direction (Z-direction) of the projection optical system PL, in order to keep an exposure region on the wafer W within a range of the depth of focus relative to the image plane by the projection optical system PL.

Figure 2:
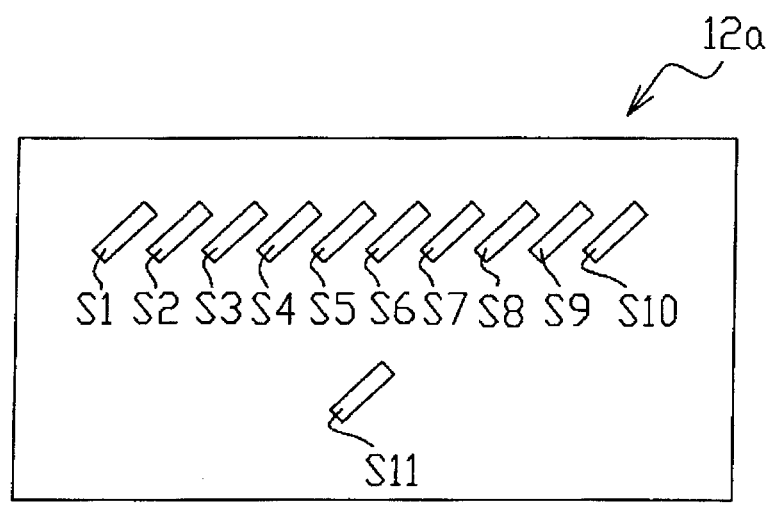
FIG. 2 is a drawing showing a configuration of an exit face of a light-sending slit prism.

Light emitted from a light source 3 forming the surface position detecting apparatus 2 passes through a condenser lens 11 to enter a light-sending slit prism 12. FIG. 2 is a drawing showing a configuration of an exit face (reference object) 12a of the light-sending slit prism 12. As shown in FIG. 2, a plurality of light-sending slits S1-S11 are arrayed on the exit face 12a. Light passing through the plurality of light-sending slits S1-S10 (first region) of the exit face 12a is used as measurement light to detect the position of the predetermined detection region on the wafer W in the Z-direction. On the other hand, light passing through the light-sending slit S11 (second region) of the exit face 12a is used as reference light to detect a detection error of the surface position detecting apparatus 2. The measurement light and reference light passing through the light-sending slit prism 12 is incident to a light-sending optical system SL to guide light onto a surface of the wafer W as a detection target surface.

The measurement light and reference light entering the light-sending optical system SL is incident to an electric plane parallel plate 16 forming the light-sending optical system SL. The electric plane parallel plate 16 is configured so as to be inclinable with respect to two directions perpendicular to the optical axis of the light-sending optical system SL and orthogonal to each other. When the angle of inclination of the electric plane parallel plate 16 is changed relative to the optical axis of the light-sending optical system SL, the angle of refraction of light is altered so as to adjust the position of emergence of light emerging from the electric plane parallel plate 16. This allows us to adjust the position of incidence of the measurement light upon impinging on the wafer W.

The measurement light and reference light passing through the electric plane parallel plate 16 travels through a second objective lens 17 and is then reflected by a vibrating mirror 21 configured as rotatable in directions of arrows in the drawing. The vibrating mirror 21 is arranged so as to be located at a focal plane of first objective lens 23 described below. The measurement light and reference light reflected by the vibrating mirror 21 passes through the first objective lens 23 to enter a vertical path prism 24 of a quadrangular prism shape having a rhombic section.

Figure 3:
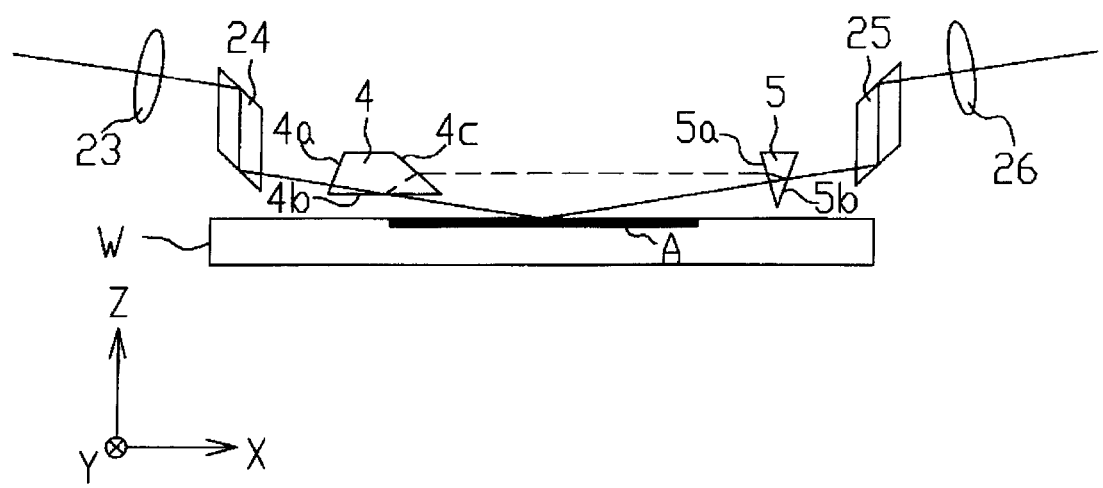
FIG. 3 is a front view showing a configuration on the wafer surface side of a surface position detecting apparatus according to the first embodiment.
Figure 4:
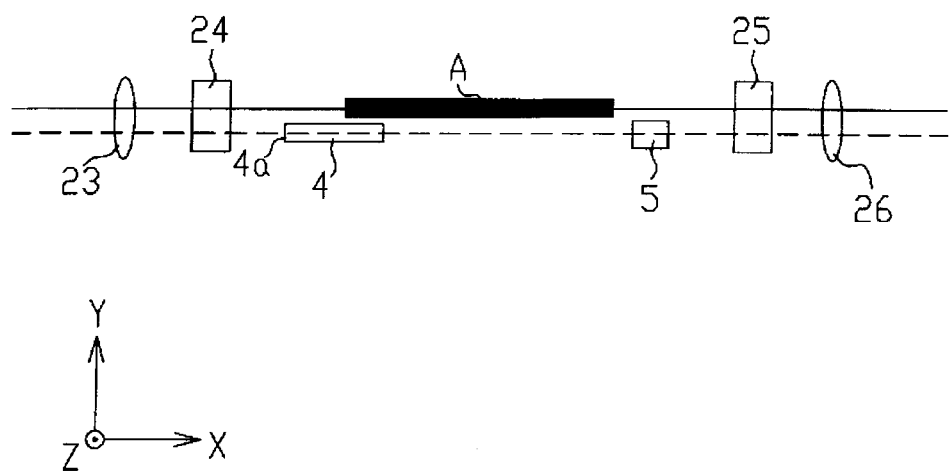
FIG. 4 is a plan view showing the configuration on the wafer surface side of the surface position detecting apparatus according to the first embodiment.

FIG. 3 and FIG. 4 are a front view and a plan view for explaining optical paths of the measurement light and the reference light from first objective lens 23 to third objective lens 26. As shown in FIGS. 3 and 4, after passing through the first objective lens 23, the measurement light and reference light transmitted by an entrance face of the vertical path prism 24 is successively reflected by a pair of reflecting faces parallel to each other, and is emitted from an exit face parallel to the entrance face.

The measurement light from the plurality of light-sending slits S1-S10 of the exit face 12a passes through the vertical path prism 24 to be emitted from the light-sending optical system SL, and then travels in a measurement optical path indicated by a solid line in FIGS. 3 and 4, to be incident from an oblique direction to a detection region A on the wafer W. The detection region A has a longitudinal direction along the traveling direction of the measurement light. A plurality of detection points are arrayed at a predetermined pitch on the detection region A and, when the detection region A is irradiated with the measurement light, irradiated regions in the shape of the light-sending slits S1-S10 are formed at the respective detection points. The measurement light reflected by the detection region A is then incident to a light-receiving optical system RL to guide light to a later-described light-receiving sensor 38.

On the other hand, the reference light from the slit S11 of the exit face 12a, as shown in FIGS. 3 and 4, passes through the vertical path prism 24 to be emitted from the light-sending optical system SL, is then incident to an entrance face 4a of a prism 4, and is reflected by a reflecting face 4b thereof. As the reference light is reflected by the reflecting face 4b, an image of the light-sending slit S11 to be formed on a light-receiving surface of later-described light-receiving sensor 38 is inverted. The reference light reflected by the reflecting face 4b emerges from an exit face 4c of the prism 4. The prism 4 functions as a splitting means to split the light into the measurement light and the reference light on a field basis and, specifically, deflects the optical path of the reference light, for guiding the reference light to a reference optical path indicated by a dashed line in FIGS. 3 and 4, which is different from the measurement optical path indicated by the solid line in FIGS. 3 and 4. The prism 4 is arranged in the space on the wafer W surface side of the light-sending optical system SL in order to form the measurement optical path and the reference optical path separated from each other.

The reference light whose optical path is deflected by the prism 4 travels in the reference optical path indicated by the dashed line in FIGS. 3 and 4, is then incident to an entrance face 5a of an angle-deviating prism 5, without passing via the surface of the wafer W, and is emitted from an exit face 5b thereof. The angle-deviating prism 5 functions as a combining means to combine the measurement light and the reference light on a field basis and, specifically, deflects the optical path of the reference light, for guiding the reference light traveling in the reference optical path indicated by the dashed line in FIGS. 3 and 4, to the direction of the measurement optical path indicated by the solid line in FIGS. 3 and 4. The angle-deviating prism 5 is arranged in the space on the wafer W surface side of the light-receiving optical system RL in order to guide the measurement optical path and the reference optical path separated from each other, through the light-receiving optical system RL to the light-receiving sensor 38. The reference light emerging from the angle-deviating prism 5 is incident to the light-receiving optical system RL.

The measurement light and reference light entering the light-receiving optical system RL is incident to a vertical path prism 25 forming the light-receiving optical system RL. The vertical path prism 25, similar to the vertical path prism 24, is a prism of a quadrangular prism shape having a rhombic section. Therefore, the measurement light and reference light passing through an entrance face of the vertical path prism 25 is successively reflected by a pair of reflecting faces parallel to each other, and thereafter passes through an exit face parallel to the entrance face, to emerge from the vertical path prism 25.

The measurement light and reference light emerging from the vertical path prism 25 passes through a third objective lens 26 and is reflected by a mirror 27. The measurement light and reference light reflected by the mirror 27 passes through a fourth objective lens 31 and an electric plane parallel plate 33 configured so as to be inclinable relative to the optical axis of the light-receiving optical system RL. The electric plane parallel plate 33, similar to the electric plane parallel plate 16, is also configured so as to be inclinable with respect to two directions perpendicular to the optical axis of the light-receiving optical system RL and orthogonal to each other. When the angle of inclination of the electric plane parallel plate 33 is changed relative to the optical axis of the light-receiving optical system RL, the position of emergence of the measurement light and reference light emerging from the electric plane parallel plate 33 can be adjusted. This allows us to adjust the position of incidence of the measurement light and reference light upon entering a later-described light-receiving slit prism 35.

After passing through the electric plane parallel plate 33 to leave the light-receiving optical system RL, the measurement light and reference light is then incident to an entrance face 35a of the light-receiving slit prism 35. In the entrance face 35a of the light-receiving slit prism 35 there are eleven apertures of a slit shape (light-receiving slits) formed corresponding to the eleven light-sending slits S1-S11 formed on the exit face 12a of the light-sending slit prism 12 shown in FIG. 2. The measurement light passes through the ten light-receiving slits corresponding to the light-sending slits S1-S10 and the reference light passes through the light-receiving slit corresponding to the light-sending slit S11.

The measurement light and reference light passing through the light-receiving slits formed on the entrance face 35a of the light-receiving slit prism 35 passes through a relay lens 36 to impinge upon a light-receiving sensor (detecting means) 38.

Figure 5:
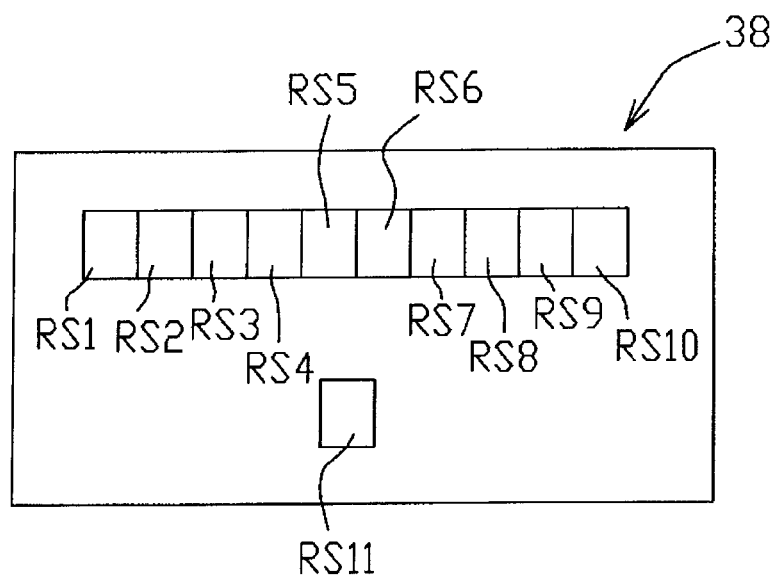
FIG. 5 is a drawing showing a configuration of a light-receiving surface of a light-receiving sensor.

FIG. 5 is a drawing showing a configuration of a light-receiving surface of the light-receiving sensor 38. On the light-receiving surface of the light-receiving sensor 38, as shown in FIG. 5, eleven light-receiving elements RS1-RS11 are arranged corresponding to the eleven light-receiving slits, respectively, formed on the entrance face 35a and the light-receiving elements receive respective light beams having passed through the eleven light-receiving slits formed on the entrance face 35a. Namely, the ten light-receiving elements RS1-RS10 receive the measurement light having passed through the ten light-receiving slits corresponding to the light-sending slits S1-S10 and the light-receiving element RS11 receives the reference light having passed through the light-receiving slit corresponding to the light-sending slit S11. The intensities of detected signals from the light-receiving elements RS1-RS11 vary with vibration of the vibrating mirror 21 and the signals are fed to an unrepresented controller.

The controller calculates an amount of adjustment in the Z-direction of the wafer stage WST, using the detection results of the detected signal intensities from the light-receiving elements RS1-RS10 and moves the wafer stage WST to the best focus position from the calculation result.

Even if the surface of the wafer W is in an ideal state (at the best focus position), the detection positions can deviate because of various factors such as installation accuracy of the light-sending optical system SL and the light-receiving optical system RL and variation in an installation environment of apparatus; e.g., the positions of slit images formed on the entrance face 35a of the light-receiving slit prism 35 deviate from the design positions as a reference, so that the positions where the actual slit images are formed can deviate from the positions where the slit images are to be formed. In order to correct the deviation of the detection positions, therefore, the surface position detecting apparatus 2 corrects the adjustment amount in the Z-direction of the wafer stage WST calculated from the light-receiving elements RS1-RS10 receiving the measurement light having passed through the light-receiving slits corresponding to the light-sending slits S1-S10, using the detection result of the detected signal intensity from the light-receiving element RS11 receiving the reference light having passed through the light-receiving slit corresponding to the light-sending slit S11. Namely, the deviation of the detection positions in the surface position detecting apparatus 2 is obtained from the detection result of the light-receiving element RS11 detecting the reference light not passing via the surface of the wafer W, an adjustment amount after correction is calculated from the obtained deviation of the detection positions and the adjustment amount before correction in the Z-direction of the wafer stage WST, and then the wafer stage WST is moved in the Z-direction, based on the calculation result, to adjust the position of the wafer stage WST in the Z-direction.

An exposure apparatus according to the second embodiment of the present invention will be described below with reference to the drawings. The configuration of the exposure apparatus according to the second embodiment is different in that the prism 4 forming the surface position detecting apparatus 2 of the exposure apparatus according to the first embodiment is changed to a pentagonal prism 40 shown in FIG. 6 and the angle-deviating prism 5 to an angle-deviating prism 50. Therefore, the second embodiment will be described below without the detailed description of the same configuration as the configuration of the exposure apparatus in the first embodiment. In the description of the exposure apparatus in the second embodiment, the same configuration as the configuration of the exposure apparatus in the first embodiment will be explained with the same reference symbols as those used in the first embodiment.

Figure 6:
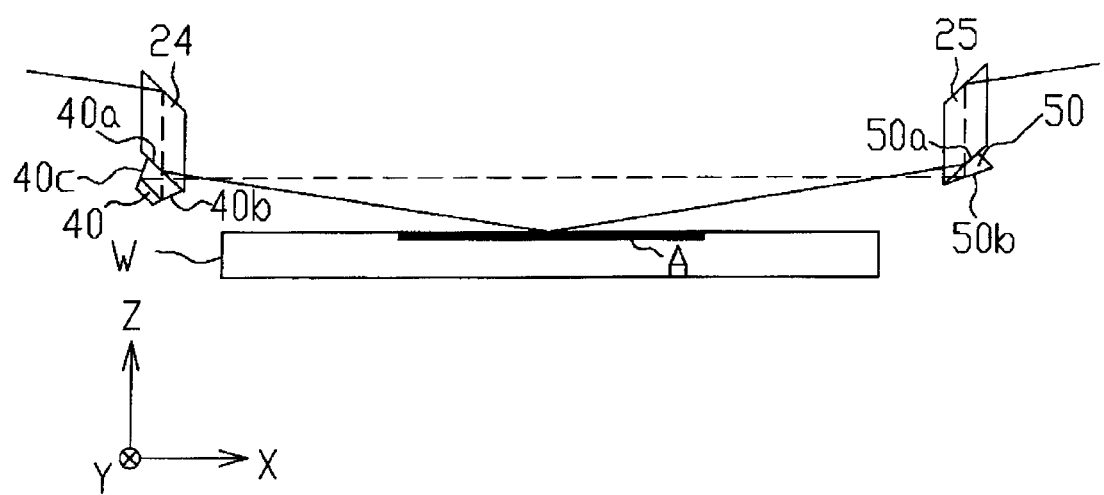
FIG. 6 is a front view showing a configuration on the wafer surface side of a surface position detecting apparatus according to the second embodiment.
Figure 7:
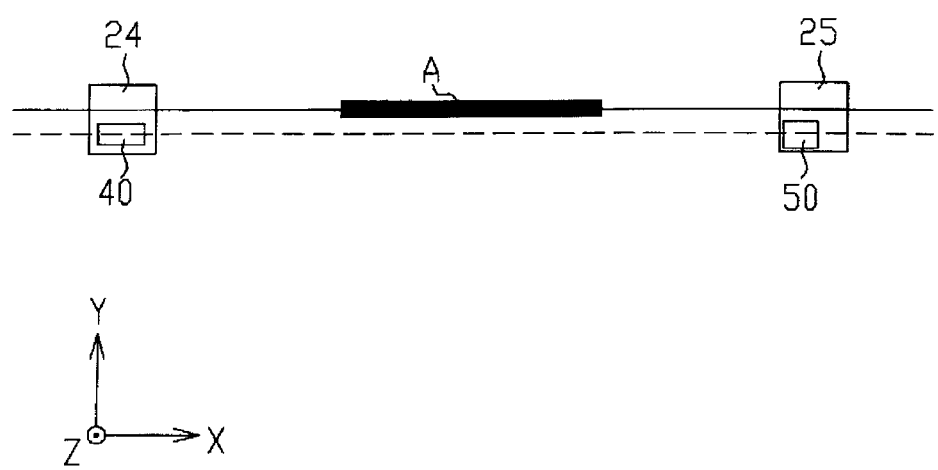
FIG. 7 is a plan view showing the configuration on the wafer surface side of the surface position detecting apparatus according to the second embodiment.

FIG. 6 and FIG. 7 are a front view and a plan view for explaining the optical paths of the measurement light and reference light from vertical path prism 24 to vertical path prism 25. The measurement light passing through the vertical path prism 24 travels in the measurement optical path indicated by a solid line in FIGS. 6 and 7 and is incident from an oblique direction to the detection region A on the wafer W. The measurement light reflected by the detection region A is incident to the vertical path prism 25. On the other hand, the reference light passing through the entrance face of the vertical path prism 24, as shown in FIGS. 6 and 7, is reflected by the first reflecting face of the vertical path prism 24, passes through the second reflecting face of the vertical path prism 24 to be incident to an entrance face 40a of the pentagonal prism 40, and is successively reflected by reflecting faces 40b, 40c. As the reference light is reflected by the reflecting face 40c, the image of the light-sending slit S11 to be formed on the light-receiving surface of the light-receiving sensor 38 is inverted. The reference light reflected by the reflecting face 40c passes through the entrance face 40a of the pentagonal prism 40 and through the second reflecting face of the vertical path prism 24 to emerge from the exit face of the vertical path prism 24. The pentagonal prism 40 functions as a splitting means to split the light into the measurement light and the reference light on a field basis and, specifically, deflects the optical path of the reference light, for guiding the reference light to the reference optical path indicated by a dashed line in FIGS. 6 and 7, which is different from the measurement optical path indicated by the solid line in FIGS. 6 and 7. The pentagonal prism 40 is arranged in the space on the wafer W surface side of the light-sending optical system SL in order to form the measurement optical path and the reference optical path separated from each other.

After the optical path is deflected by the pentagonal prism 40, the reference light emerging from the vertical path prism 24 travels in the reference optical path indicated by the dashed line in FIGS. 6 and 7, is then incident to the entrance face of the vertical path prism 25, without passing via the surface of the wafer W, and passes through the first reflecting face of the vertical path prism 25 to be incident to an entrance face 50a of the angle-deviating prism 50. The reference light incident to the entrance face 50a is reflected by a reflecting face 50b of the angle-deviating prism 50, and passes through the entrance face 50a of the angle-deviating prism 50 to enter the vertical path prism 25. The angle-deviating prism 50 functions as a combining means to combine the measurement light and the reference light on a field basis and, specifically, deflects the optical path of the reference light, for guiding the reference light traveling in the reference optical path indicated by the dashed line in FIGS. 6 and 7, to the direction of the measurement optical path indicated by the solid line in FIGS. 6 and 7. The angle-deviating prism 50 is arranged in the space on the wafer W surface side of the light-receiving optical system RL in order to guide the measurement optical path and the reference optical path separated from each other, through the light-receiving optical system RL to the light-receiving sensor 38. After the optical path is deflected by the angle-deviating prism 50, the reference light incident to the vertical path prism 25 is reflected by the second reflecting face of the vertical path prism 25 and emerges from the exit face of the vertical path prism 25. The measurement light and reference light emerging from the vertical path prism 25 passes through the elements from the third objective lens 26 to the relay lens 36 to impinge upon the light-receiving sensor 38.

An exposure apparatus according to the third embodiment of the present invention will be described below with reference to the drawings. The configuration of the exposure apparatus according to the third embodiment is different in that the prism 4 and angle-deviating prism 5 forming the surface position detecting apparatus 2 of the exposure apparatus in the first embodiment are changed to an angle-deviating prism 42, a mirror 60, and an angle-deviating prism 52 shown in FIG. 8. Therefore, the third embodiment will be explained below without the detailed description of the same configuration as the configuration of the exposure apparatus in the first embodiment. In the description of the exposure apparatus in the third embodiment, the same configuration as the configuration of the exposure apparatus in the first embodiment will be explained with the same reference symbols as those in the first embodiment.

Figure 8:
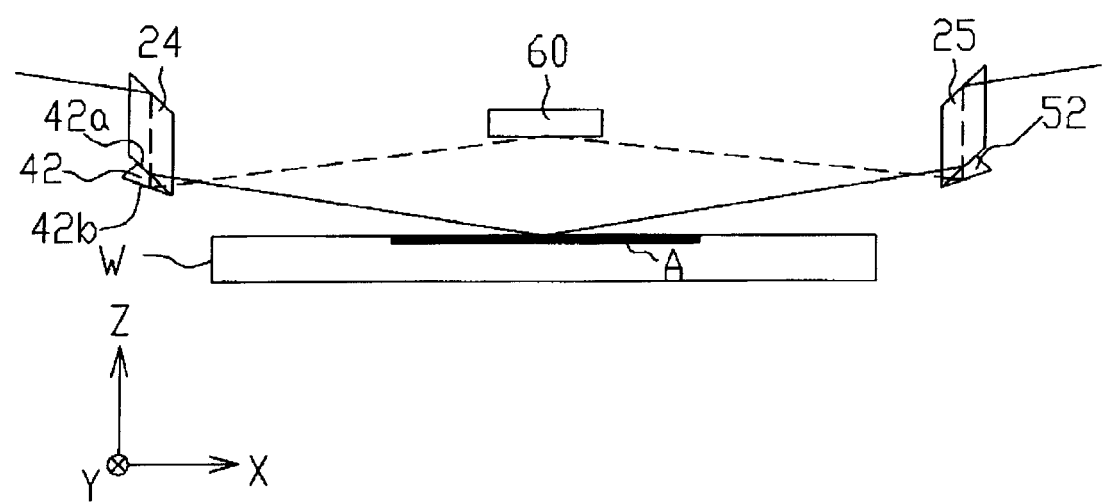
FIG. 8 is a front view showing a configuration on the wafer surface side of a surface position detecting apparatus according to the third embodiment.
Figure 9:
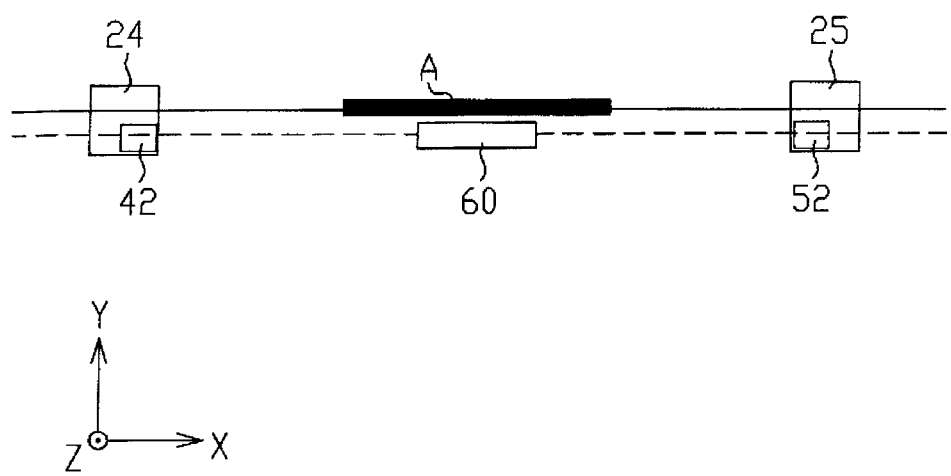
FIG. 9 is a plan view showing the configuration on the wafer surface side of the surface position detecting apparatus according to the third embodiment.

FIG. 8 and FIG. 9 are a front view and a plan view for explaining the optical paths of the measurement light and reference light from vertical path prism 24 to vertical path prism 25. The measurement light passing through the vertical path prism 24 travels in the measurement optical path indicated by a solid line in FIGS. 8 and 9 and is incident from an oblique direction to the detection region A on the wafer W.

The measurement light reflected by the detection region A is then incident to the vertical path prism 25.

On the other hand, the reference light passing through the entrance face of the vertical path prism 24, as shown in FIGS. 8 and 9, is reflected by the first reflecting face of the vertical path prism 24, passes through the second reflecting face of the vertical path prism 24, and passes through an entrance face 42a of the angle-deviating prism 42. The reference light passing through the entrance face 42a of the angle-deviating prism 42 is reflected by a reflecting face 42b thereof, passes through the entrance face 42a, and is emitted from the exit face of the vertical path prism 24. The angle-deviating prism 42 functions as a splitting means to split the light into the measurement light and the reference light on a field basis and, specifically, deflects the optical path of the reference light, for guiding the reference light to the reference optical path indicated by a dashed line in FIGS. 8 and 9, which is different from the measurement optical path indicated by the solid line in FIGS. 8 and 9. The angle-deviating prism 42 is arranged in the space on the wafer W surface side of the light-sending optical system SL in order to form the measurement optical path and the reference optical path separated from each other.

After the optical path is deflected by the angle-deviating prism 42, the reference light emerging from the vertical path prism 24 travels in the reference optical path indicated by the dashed line in FIGS. 8 and 9 and is reflected by the mirror 60. As the reference light is reflected by the mirror 60, the image of the light-sending slit S11 to be formed on the light-receiving surface of the light-receiving sensor 38 is inverted. The mirror 60 is fixed to the main body of the exposure apparatus and fixed at a position where it does not impede the travel of the exposure light through the projection optical system PL. The reference light reflected by the mirror 60 is then incident to the entrance face of the vertical path prism 25, without passing via the surface of the wafer W, passes through the first reflecting face of the vertical path prism 25, and is incident to the angle-deviating prism 52. The configuration and function of the angle-deviating prism 52 are the same as those of the angle-deviating prism 50 in the second embodiment (cf. FIGS. 6 and 7) and therefore the detailed description thereof is omitted herein. After the optical path is deflected by passage through the angle-deviating prism 52, the reference light passing through the first reflecting face of the vertical path prism 25 is reflected by the second reflecting face of the vertical path prism 25 and emerges from the exit face of the vertical path prism 25. The measurement light and reference light emerging from the vertical path prism 25 passes through the elements from the third objective lens 26 to the relay lens 36 to impinge upon the light-receiving sensor 38.

An exposure apparatus according to the fourth embodiment of the present invention will be described below with reference to the drawings. The configuration of the exposure apparatus according to the fourth embodiment is different in that the prism 4 and angle-deviating prism 5 forming the surface position detecting apparatus 2 of the exposure apparatus in the first embodiment are changed to an angle-deviating prism 44, lenses (e.g., cylindrical lenses) 62, 64, and an angle-deviating prism 54 shown in FIG. 10. Therefore, the fourth embodiment will be explained below without the detailed description of the same configuration as the configuration of the exposure apparatus in the first embodiment. In the description of the exposure apparatus in the fourth embodiment, the same configuration as the configuration of the exposure apparatus in the first embodiment will be explained with the same reference symbols as those in the first embodiment.

Figure 10:
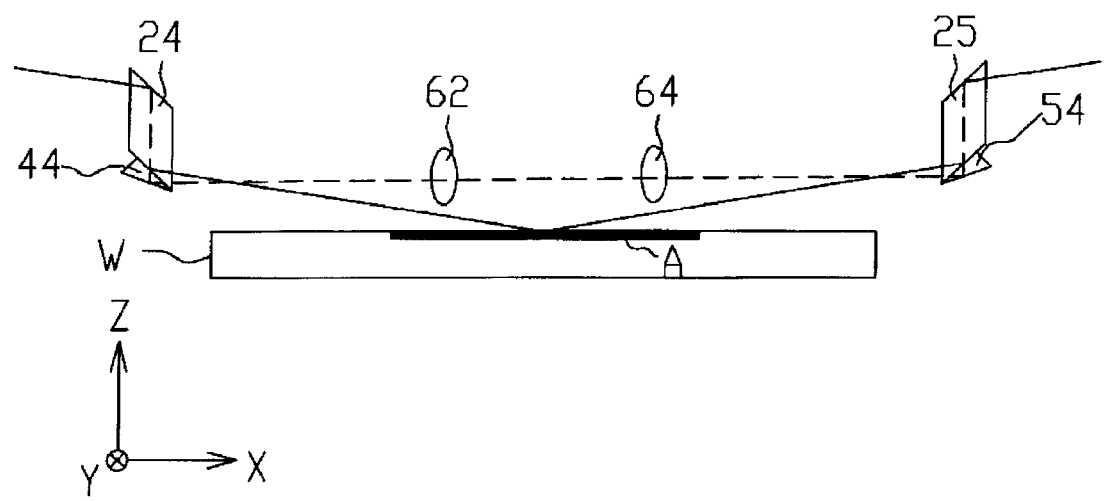
FIG. 10 is a front view showing a configuration on the wafer surface side of a surface position detecting apparatus according to the fourth embodiment.
Figure 11:
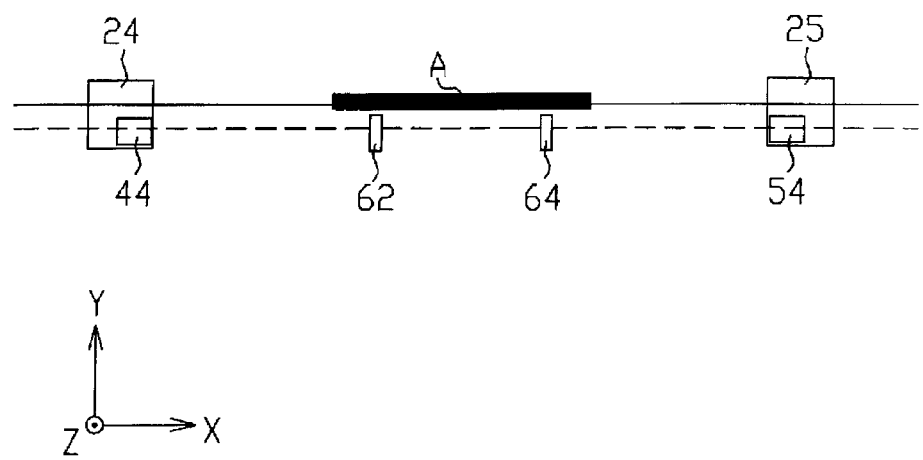
FIG. 11 is a plan view showing the configuration on the wafer surface side of the surface position detecting apparatus according to the fourth embodiment.

FIG. 10 and FIG. 11 are a front view and a plan view for explaining the optical paths of the measurement light and reference light from vertical path prism 24 to vertical path prism 25. The measurement light passing through the vertical path prism 24 travels in the measurement optical path indicated by a solid line in FIGS. 10 and 11 and is then incident from an oblique direction to the detection region A on the wafer W. The measurement light reflected by the detection region A is incident to the vertical path prism 25. On the other hand, the reference light passing through the entrance face of the vertical path prism 24, as shown in FIGS. 10 and 11, is reflected by the first reflecting face of the vertical path prism 24, passes through the second reflecting face of the vertical path prism 24, and is incident to the angle-deviating prism 44. The configuration and function of the angle-deviating prism 44 are the same as those of the angle-deviating prism 42 in the third embodiment (cf. FIGS. 8 and 9) and the detailed description thereof is omitted herein. After the optical path is deflected by passage through the angle-deviating prism 44, the reference light incident to the second reflecting face of the vertical path prism 24 emerges from the exit face of the vertical path prism 24.

The reference light emerging from the vertical path prism 24 travels in the reference optical path indicated by a dashed line in FIGS. 10 and 11 and passes through the lenses 62, 64. As the reference light passes through the lenses 62, 64, the image of the light-sending slit S1 to be formed on the light-receiving surface of the light-receiving sensor 38 is inverted. The reference light passing through the lenses 62, 64 is incident to the entrance face of the vertical path prism 25, without passing via the surface of the wafer W, and passes through the first reflecting face of the vertical path prism 25 to enter the angle-deviating prism 54. The configuration and function of the angle-deviating prism 54 are the same as those of the angle-deviating prism 50 in the second embodiment (cf. FIGS. 6 and 7) and thus the detailed description thereof is omitted herein. After the optical path is deflected by passage through the angle-deviating prism 54, the reference light incident to the vertical path prism 25 is reflected by the second reflecting face of the vertical path prism 25 and emerges from the exit face of the vertical path prism 25. The measurement light and reference light emerging from the vertical path prism 25 passes through the elements from the third objective lens 26 to the relay lens 36 to impinge upon the light-receiving sensor 38.

The fourth embodiment uses the cylindrical lenses 62, 64 with a power only in the XZ plane to invert the image of the light-sending slit S11 in the direction of intersection between the XZ plane and the light-receiving surface of the light-receiving sensor, but the number of imaging times by the cylindrical lenses 62, 64 is not limited to one but may be any odd number.

Figure 12:
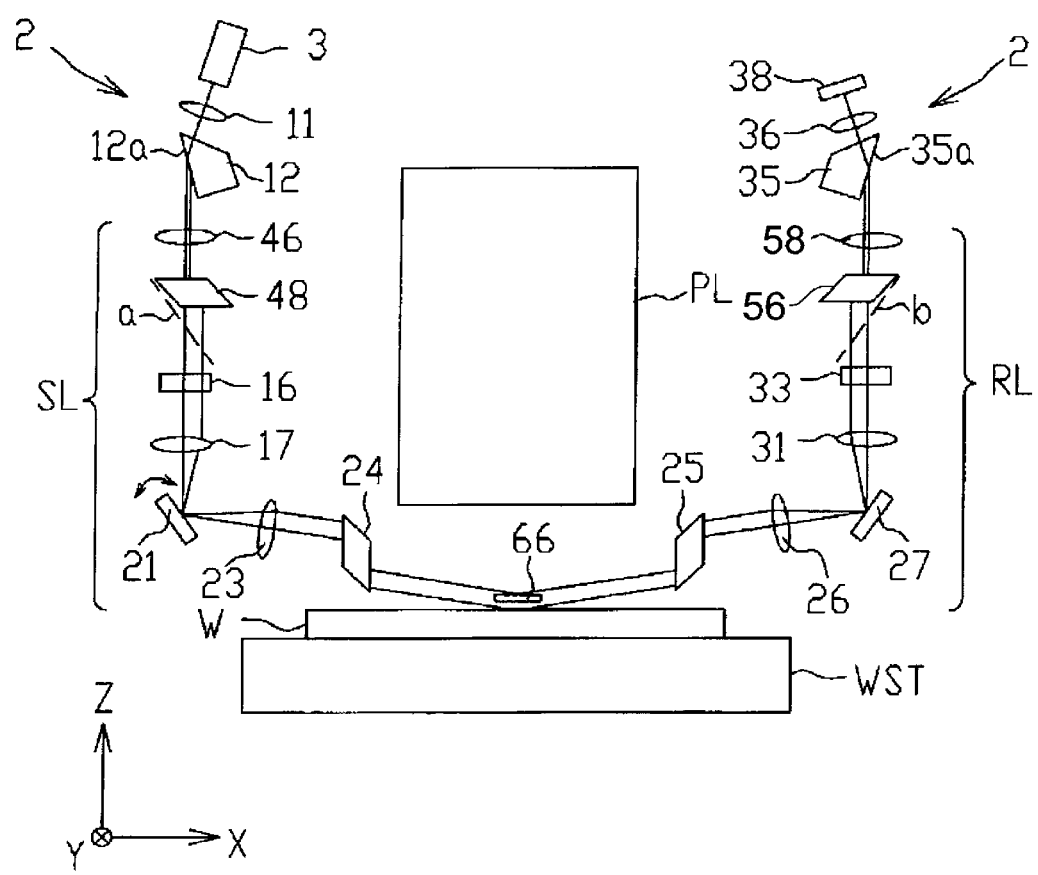
FIG. 12 is a drawing showing a configuration of a surface position detecting apparatus according to the fifth embodiment.

An exposure apparatus according to the fifth embodiment of the present invention will be described below with reference to the drawings. In the exposure apparatus of the fifth embodiment, as shown in FIG. 12, a relay optical system 46 and a shift prism 48 are arranged in the optical path between the light-sending slit prism 12 and the electric plane parallel plate 16, a shift prism 56 and a relay optical system 58 are arranged in the optical path between the electric plane parallel plate 33 and the light-receiving slit prism 35, and a mirror 66 is arranged in the optical path of the reference light between the vertical path prism 24 and the vertical path prism 25, in place of the prism 4 and angle-deviating prism 5 forming the surface position detecting apparatus 2 of the exposure apparatus in the first embodiment. Therefore, the fifth embodiment will be explained below without the detailed description of the same configuration as the configuration of the exposure apparatus in the first embodiment. In the description of the exposure apparatus in the fifth embodiment, the same configuration as the configuration of the exposure apparatus in the first embodiment will be explained with the same reference symbols as those in the first embodiment.

FIG. 12 is a drawing showing the configuration of the surface position detecting apparatus 2 according to the fifth embodiment. As shown in FIG. 12, the measurement light passing through the light-sending slit prism 12 passes through the relay optical system 46 to enter the electric plane parallel plate 16. On the other hand, the reference light passing through the light-sending slit prism 12 passes through the relay optical system 46 to enter an entrance face of the shift prism 48. The reference light transmitted by the entrance face of the shift prism 48 is successively reflected by a pair of reflecting faces parallel to each other, emerges from an exit face parallel to the entrance face, and is incident to the electric plane parallel plate 16.

The shift prism 48 functions as a splitting means to split the light into the measurement light and the reference light on a field basis and, specifically, shifts the optical path of the reference light in the +X-direction by successively reflecting the reference light by the pair of reflecting faces parallel to each other, for separating the optical path of the reference light from the optical path of the measurement light. The shift prism 48 is arranged near a plane optically conjugate with the surface of the wafer W, which is formed at a position indicated by a dashed line a in FIG. 12 with intervention of the relay optical system 46. The shift prism 48 may be arranged on the plane optically conjugate with the surface of the wafer W and, when the shift prism 48 as a splitting means is arranged on or near the plane optically conjugate with the surface of the wafer W, the incident light can be split into the measurement light and the reference light on a field basis.

Figure 13:
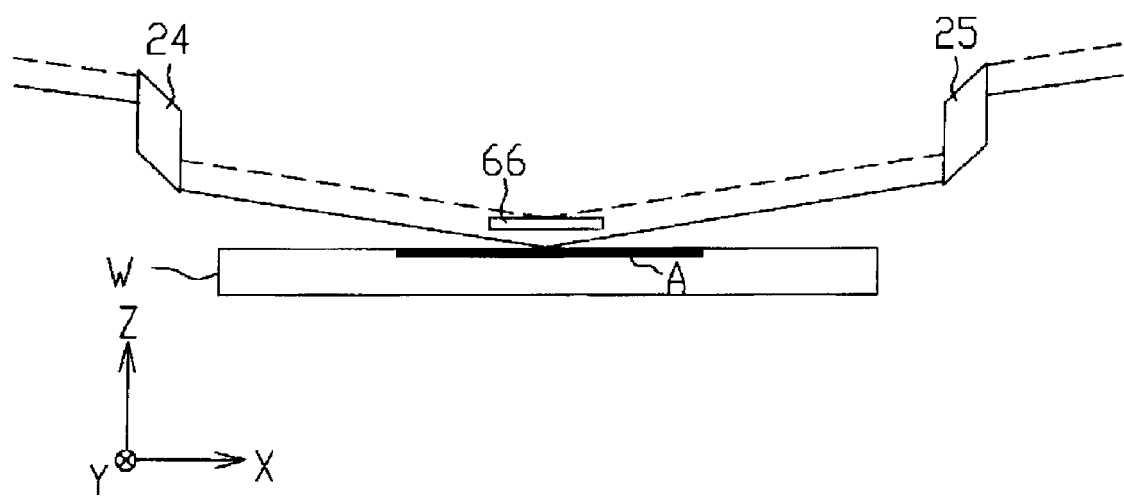
FIG. 13 is a front view showing the configuration on the wafer surface side of the surface position detecting apparatus according to the fifth embodiment.
Figure 14:
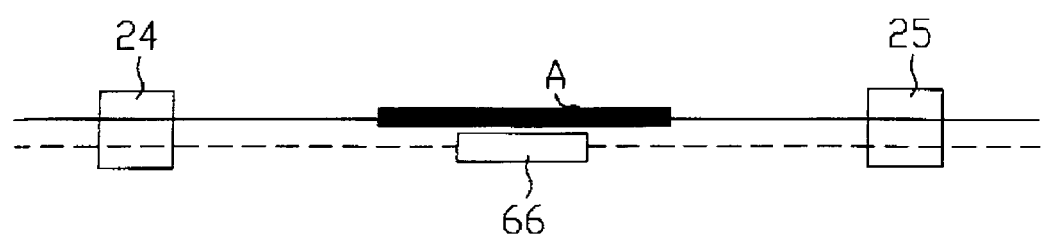
FIG. 14 is a plan view showing the configuration on the wafer surface side of the surface position detecting apparatus according to the fifth embodiment.
Figure 14:
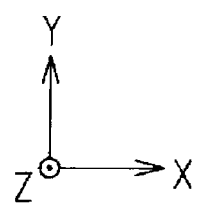

The measurement light and the reference light travels through their respective optical paths between the electric plane parallel plate 16 and the vertical path prism 24. FIG. 13 and FIG. 14 are a front view and a plan view showing the configuration between the vertical path prism 24 and the vertical path prism 25. The measurement light passing through the vertical path prism 24 travels in the measurement optical path indicated by a solid line in FIGS. 13 and 14 and is incident from an oblique direction to the detection region A on the wafer W. The measurement light reflected by the detection region A is incident to the vertical path prism 25.

On the other hand, the reference light passing through the vertical path prism 24 travels in the reference optical path indicated by a dashed line in FIGS. 13 and 14 and is reflected by the mirror 66. The mirror 66 is fixed to the main body of the exposure apparatus and fixed at a position where it does not impede the travel of the exposure light through the projection optical system PL. As the reference light is reflected by the mirror 66, the image of the light-sending slit S11 to be formed on the light-receiving surface of the light-receiving sensor 38 is inverted. The reference light reflected by the mirror 66 is incident to the entrance face of the vertical path prism 25, without passing via the surface of the wafer W.

The measurement light and reference light incident to the entrance face of the vertical path prism 25 travels through their respective optical paths between the vertical path prism 25 and the electric plane parallel plate 33, as shown in FIG. 12. The measurement light passing through the electric plane parallel plate 33 passes through the relay optical system 58 to enter the light-receiving slit prism 35. On the other hand, the reference light passing through the electric plane parallel plate 33 is incident to an entrance face of the shift prism 56.

The reference light transmitted by the entrance face of the shift prism 56 is successively reflected by a pair of reflecting faces parallel to each other, then emerges from an exit face parallel to the entrance face, and is then incident to the relay optical system 58.

The shift prism 56 functions as a combining means to combine the measurement light and the reference light on a field basis and, specifically, shifts the optical path of the reference light in the +X-direction by successively reflecting the reference light by the pair of reflecting faces parallel to each other, for combining the optical path of the reference light and the optical path of the measurement light on a field basis. The shift prism 56 is arranged near a plane optically conjugate with the surface of the wafer W, which is formed at a position indicated by a dashed line b in FIG. 12 with intervention of the relay optical system 58. The shift prism 56 may be arranged on the plane optically conjugate with the surface of the wafer W and, when the shift prism 56 as a combining means is arranged on or near the plane optically conjugate with the surface of the wafer W, the measurement light and the reference light can be combined on a field basis. The reference light passing through the relay optical system 58 is incident to the light-receiving slit prism 35. The measurement light and reference light passing through the light-receiving slit prism 35 passes through the relay lens 36 to impinge upon the light-receiving sensor 38.

Since the surface position detecting apparatus according to each of the above-described embodiments is provided with the light-receiving sensor to independently detect the measurement light traveling via the surface of the wafer W and the reference light not traveling via the surface of the wafer W, it is able to detect the deviation of the detection positions with the measurement light from the detection result of the reference light, at the same time as the surface position of the wafer W is detected based on the detection result of the measurement light. Therefore, it is feasible to quickly perform the correction for the detection result of the measurement light using the detection result of the reference light and to highly accurately detect the surface position of the surface of the wafer W. There is no need for detecting the deviation of the detection positions in the surface position detecting apparatus 2 by means of another detection system, and the deviation of the detection positions is accurately detected from the detection result of the reference light detected by the light-receiving sensor via much the same optical members as the optical members that the measurement light passes; therefore, the surface position of the detection target surface can be detected with high accuracy.

Since the surface position detecting apparatus according to each of the aforementioned embodiments is configured to independently detect the measurement light and the reference light, it is able to reduce a detection error due to change in reflectance on the surface of the wafer W, when compared with a case where the measurement light beam and the reference light beam are made to interfere with each other to detect interference fringes. In the interference fringe detecting method, the change in reflectance of the wafer W results in change in the intensity ratio of the measurement light and the reference light and thus results in reduction in contrast of the interference fringes. Detection of the interference fringes of such low contrast will lead to considerable reduction in detection accuracy. On the other hand, the surface position detecting apparatus according to each of the above-described embodiments has the advantage that the reduction in detection accuracy is unlikely to occur even with change in the intensity ratio of the measurement light and the reference light.

Figure 15:
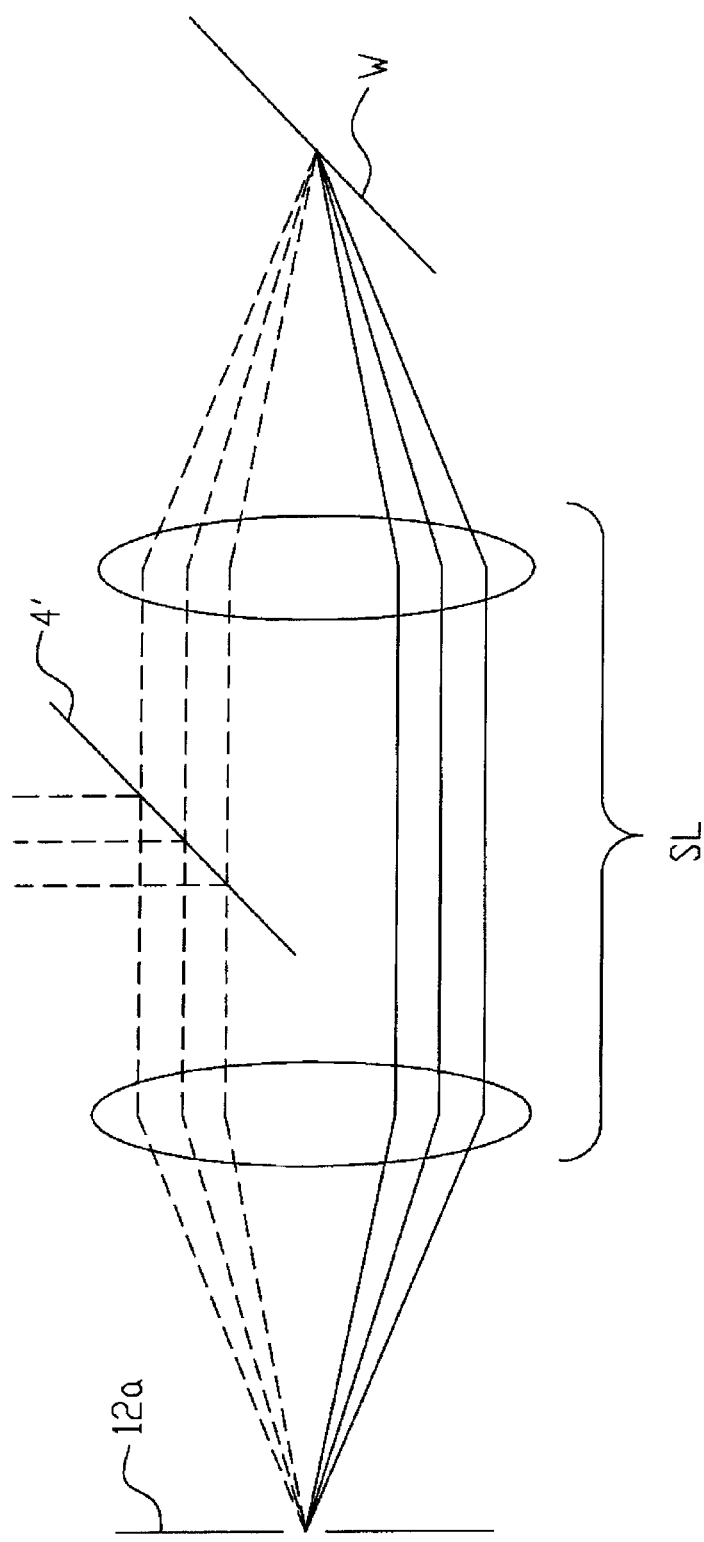
FIG. 15 is a drawing for explaining pupil splitting.
Figure 16:
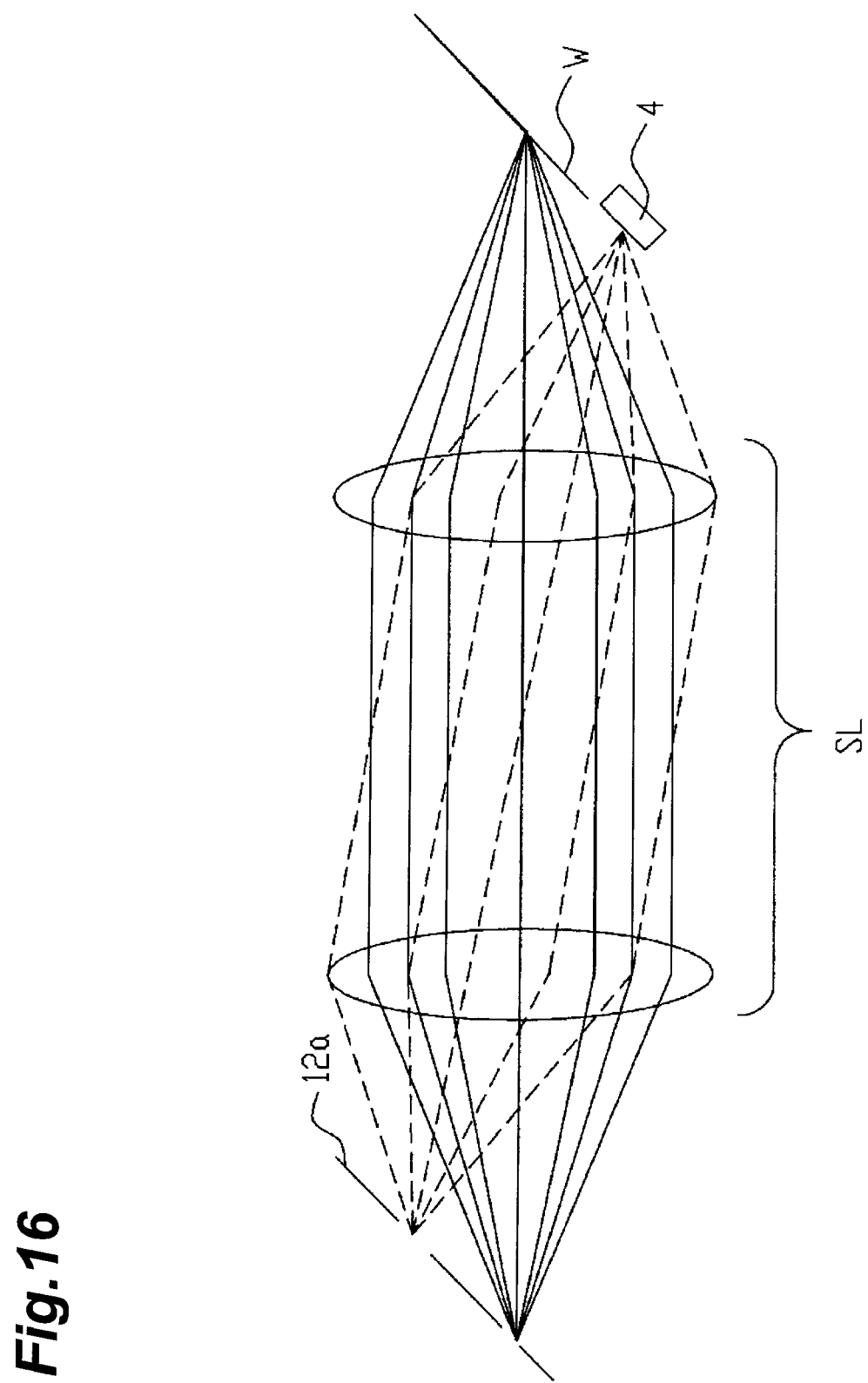
FIG. 16 is a drawing for explaining field splitting.

Since the surface position detecting apparatus according to each of the aforementioned embodiments is configured to split the light into the measurement light and the reference light on a field basis, it is able to detect the deviation of the detection positions with higher accuracy than in a case where the light is split on a pupil basis. FIG. 15 is a drawing showing an optical path of travel of reference light (indicated by dashed lines) which is split on a pupil basis by optical member 4' to deflect the optical path, and an optical path of travel of measurement light (indicated by solid lines) which passes through the light-sending optical system SL to impinge upon the surface of the wafer W. FIG. 16 is a drawing showing an optical path of travel of reference light (indicated by dashed lines) which is split on a field basis by prism 4 to deflect the optical path, and an optical path of travel of measurement light (indicated by solid lines) which passes through the light-sending optical system SL to impinge upon the surface of the wafer W. In the pupil-split case, as shown in FIG. 15, the measurement light and the reference light travels through completely different portions, with no overlap between the optical paths. Therefore, the deviation of the detection result of the measurement light is calculated based on the detection result of the reference light passing through the different portion from the measurement light and affected by a different air fluctuation or the like from that of the measurement light, and it is thus difficult to accurately detect the deviation of the detection positions. In contrast to it, in the field-split case, as shown in FIG. 16, the measurement light and the reference light passes through much the same portion near the pupil position of the light-sending optical system SL, and thus they overlap each other. Therefore, the deviation of the detection result of the measurement light is calculated based on the detection result of the reference light affected by much the same air fluctuation or the like as that of the measurement light because of the passage through much the same portion as the measurement light, and it is thus feasible to detect the deviation of the detection positions with higher accuracy.

In the surface position detecting apparatus according to each of the aforementioned embodiments, the optical member (4, 40, 60, 62, 64, 66) to invert the image of the reference object is arranged in the reference optical path; therefore, the images of the light-sending slits by the measurement light having traveled through the measurement optical path are oriented in the same direction as the image of the light-sending slit by the reference light having traveled through the reference optical path, and errors due to the influence of the air fluctuation or the like in the atmosphere near the wafer W occur in the same direction between the measurement light and the reference light. This permits the apparatus to detect the deviation of the detection positions with higher accuracy.

Since the first and second embodiments described above adopt the configuration without any optical member in the reference optical path near the detection region A, they have the advantage of higher degrees of freedom for the arrangement of the surface position detecting apparatus. Since the second embodiment permits a part of the splitting means and the combining means to be composed of an existing optical member, it has the advantage that the optical system can be made simpler.

Since the third embodiment adopts the configuration to invert the image of the reference object by the relay optical system instead of the reflecting surface, it has the advantage that even if the relay optical system is displaced with vibration or the like, influence of the error can be reduced more than in the case of the reflecting surface.

Since in the fourth embodiment the measurement optical path and the reference optical path are approximately parallel to each other, there is the advantage that degrees of influence of error due to air fluctuation or the like can be made approximately equal between the measurement light and the reference light. In the first to third embodiments, different from the fourth embodiment, the measurement optical path and the reference optical path are not parallel to each other, but the difference between degrees of influence of error due to the non-parallelism of the measurement optical path and the reference optical path can be practically ignored if the angle of incidence to the surface of the wafer W is extremely large (typically, 80° or more).

Since the exposure apparatus according to each of the foregoing embodiments is configured to detect the position of the wafer W in the Z-direction by the surface position detecting apparatus 2 according to the present invention, it is able to quickly perform the correction for the detection result of the measurement light and to perform highly accurate exposure of the pattern of the reticle R on the wafer W at high throughput.

Figure 17:
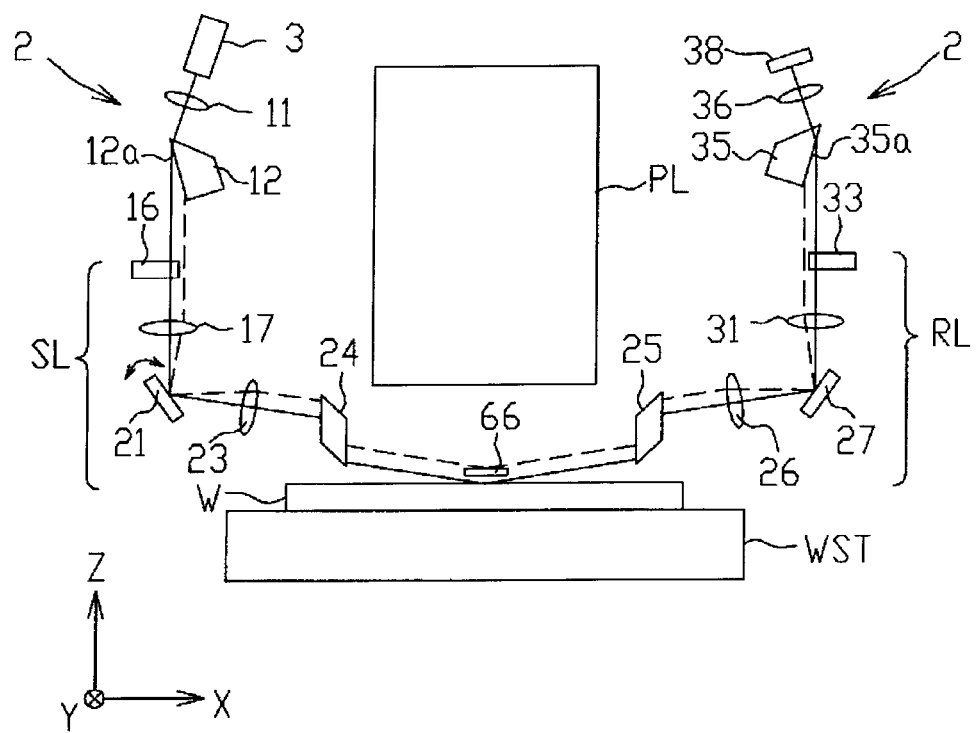
FIG. 17 is a drawing showing a configuration of another surface position detecting apparatus.

The surface position detecting apparatus according to each of the foregoing embodiments was described with the example of the configuration wherein the reference light passed through the electric plane parallel plates 16, 33. In this case, if there is a variation in the installation positions of the electric plane parallel plates 16, 33, an error of the detection result of the measurement light due to the variation in the installation positions of the electric plane parallel plates 16, 33 can be detected from the detection result of the reference light. However, if the inclination of the electric plane parallel plates 16, 33 becomes too large for the reference light to fall within the detection range thereof, the reference light can travel in a direction in which it fails to impinge, for example, upon the mirror 66 shown in FIG. 14. In this case, the reference light is not reflected by the mirror 66 and the reference light is not detected, resulting in failure in detecting the error of the detection result of the measurement light. Therefore, the apparatus may be configured so that the reference light does not pass through the electric plane parallel plates 16, 33, i.e., so that the reference light travels through the optical path indicated by a dashed line in FIG. 17. In this case, even if the inclination of the electric plane parallel plates 16, 33 becomes large, the reference light not passing through the electric plane parallel plates 16, 33 will not be affected and therefore the reference light can be detected.

The apparatus can also be configured as follows: for example, two light-sending slits for passage of the reference light are formed, the reference light through the first light-sending slit is guided through the electric plane parallel plates 16, 33, and the reference light through the second light-sending slit does not pass through the electric plane parallel plates 16, 33. Namely, the apparatus may be configured to form the reference light passing through the electric plane parallel plates 16, 33 and the reference light not passing through them.

The surface position detecting apparatus according to each of the aforementioned embodiments is configured to deflect the optical path of the reference light by the deflecting member such as the prism, but the apparatus may be configured to deflect the optical path of the measurement light by a deflecting member such as a prism. The apparatus may also be configured to deflect the optical path of the measurement light and the optical path of the reference light by a deflecting member such as a prism.

In the surface position detecting apparatus according to each of the foregoing embodiments, one light-sending slit S11 for guiding the reference light to the reference optical path is provided on the exit face 12a of the light-sending slit prism 12, but it is also possible to provide two or more light-sending slits for guiding the reference light to the reference optical path.

Figure 18:
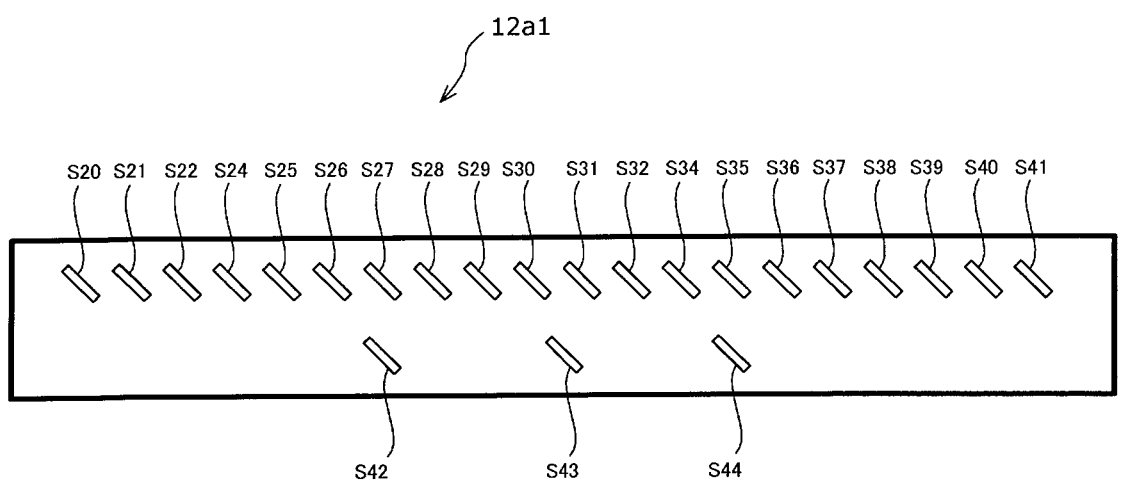
FIG. 18 is a drawing showing a configuration of an exit face of a light-sending slit prism in a surface position detecting apparatus according to a modification example.

FIG. 18 is a plan view of an exit face 12a1 of the light-sending slit prism with three light-sending slits S42-S44 for guiding the reference light to the reference optical path. In FIG. 18, light passing through a plurality of light-sending slits S20-S41 (first region) on the exit face 12a1 is used as the measurement light to detect the position of the predetermined detection region on the wafer W in the Z-direction. On the other hand, light passing through the light-sending slits S42-44 (second region) on the exit face 12a1 is used as the reference light to detect the detection error of the surface position detecting apparatus 2.

Figure 19A:
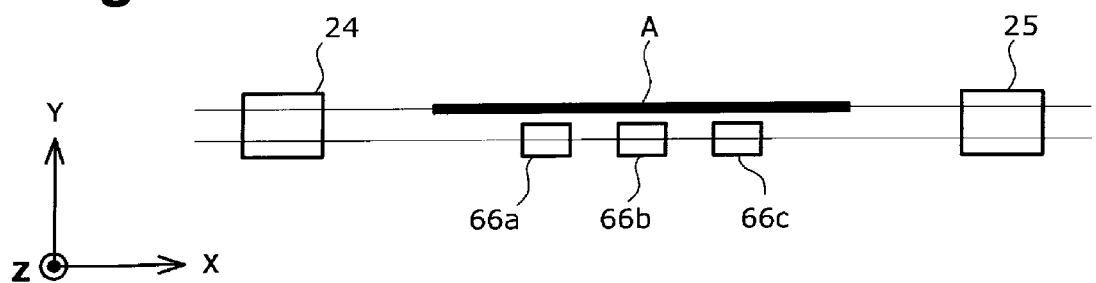
Figure 19B:
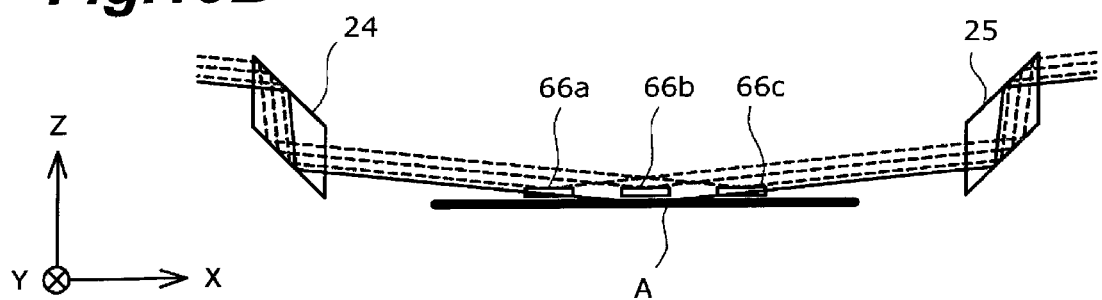

FIG. 19 is a drawing to explain arrangement of mirrors 66a-66c arranged in the reference optical path of the reference light from the plurality of light-sending slits S42-S44, wherein FIG. 19A is a plan view and FIG. 19B a side view. In FIG. 19, the members with the same functionality as in the surface position detecting apparatus of the fifth embodiment shown in FIGS. 12 to 14 are denoted by the same reference symbols.

In FIG. 19, the reference light from the light-sending slit S42 shown in FIG. 18 travels through the vertical path prism 24, is reflected by the mirror 66a, and is then incident to the vertical path prism 25. The reference light from the light-sending slit S43 in FIG. 18 travels through the vertical path prism 24, is reflected by the mirror 66b, and is then incident to the vertical path prism 25; the reference light from the light-sending slit S44 in FIG. 18 travels through the vertical path prism 24, is reflected by the mirror 66c, and is then incident to the vertical path prism 25.

When the number of light-sending slits for guiding light as the reference light to the reference optical path is not less than two as in this example shown in FIGS. 18 and 19, there is the advantage that the error of the detection result of the measurement light can be detected with higher accuracy.

The above-described example showed the configuration wherein the mirrors 66a-66c for inverting the image of the reference object by reflection of the reference light were provided for the respective slits, but it is also possible to adopt a configuration wherein these mirrors 66a-66c are integrally formed.

In each of the above embodiments the difference between the number of reflecting surfaces arranged in the measurement optical path and the number of reflecting surfaces arranged in the reference optical path is one, but this difference may be any odd number.

Figure 20A:
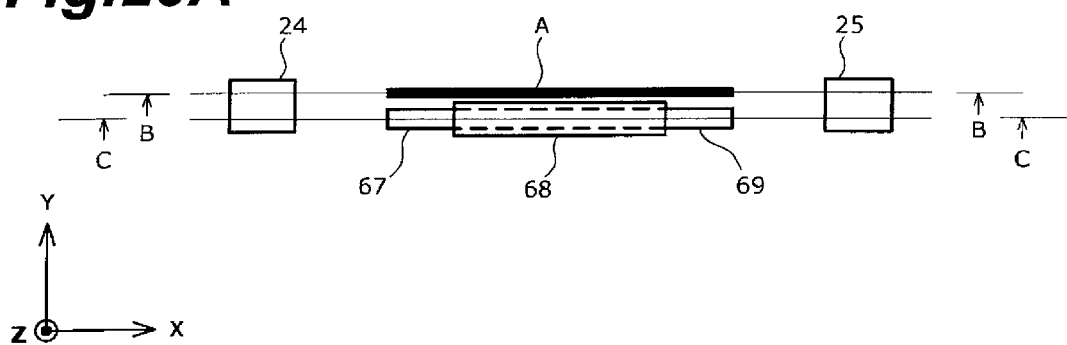
Figure 20B:
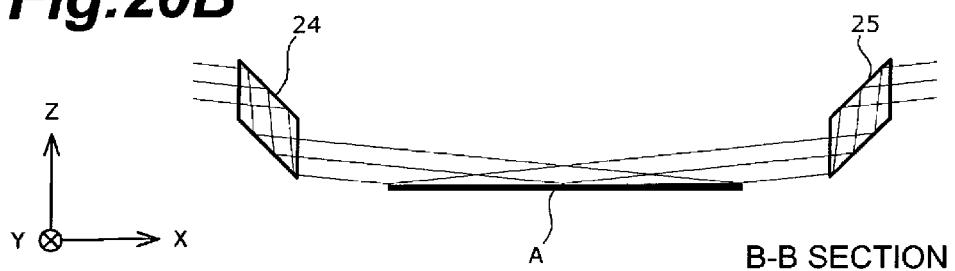
Figure 20C:
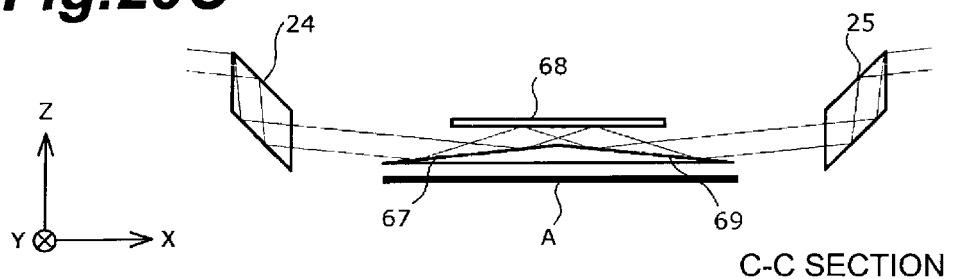

FIGS. 20A-20C are drawings showing a modification example in which the plurality of mirrors 66a-66c shown in FIG. 19 are replaced by three reflecting surfaces, wherein FIG. 20A is a plan view, FIG. 20B a B-B sectional view, and FIG. 20C a C-C sectional view.

The measurement light from the light-sending slits S20-S41 located in the first region of the light-sending slit prism shown in FIG. 18 travels as shown in FIG. 20B: specifically, it passes through the vertical path prism 24, is incident from an oblique direction to the detection region A on the wafer W, is reflected on the detection region A, and thereafter is incident to the vertical path prism 25. On the other hand, the reference light from the light-sending slits S42-S44 located in the second region of the light-sending slit prism shown in FIG. 18, travels through the vertical path prism 24, is reflected in order by the mirrors 67, 68, 69, and thereafter is incident to the vertical path prism 25.

The mirrors 67 and 69 are composed of two planar reflecting surfaces arranged so as to have a ridge line extending in the Y-direction, and the mirror 68 is composed of a planar reflecting surface located in the XY plane. In the examples of FIGS. 20A-20C, as described above, the difference between the number of reflecting surfaces arranged in the measurement optical path and the number of reflecting surfaces arranged in the reference optical path is an odd number, so that errors can occur in the same direction between the measurement light and the reference light.

In the examples of FIGS. 20A-20C, the plurality of mirrors 67-69 can also be constructed of a prism member of a concave V-shape and in this case, internal reflections in the prism member of the concave V-shape are used. Since this configuration permits the plurality of reflecting surfaces to be integrally formed, error-causing factors can be reduced.

In the examples of FIGS. 18 to 20A-20C, the mirrors 66a-66c, 67-69 can also be fixed to the main body of the exposure apparatus, to the projection optical system, or to a reference frame or the like fixed on the projection optical system. In the exposure apparatus of each of the above embodiments the position of the detection region A may be located at the position near the projection optical system PL, in the projection region, or in a conveyance path extending from a loading position of wafer W to the exposure position. The technology of detecting the surface position of the wafer W in the conveyance path is proposed in U.S. Pat. Provisional Application No. 60/780,049.

The exposure apparatus according to each of the above embodiments was explained using the example of the liquid immersion type exposure apparatus in which the liquid was supplied to between the wafer W and the optical member on the wafer W side forming the projection optical system PL, but the present invention is also applicable to the dry type exposure apparatus without supply of liquid to between the wafer W and the optical member on the wafer W side forming the projection optical system PL.

The exposure apparatus according to each of the foregoing embodiments is manufactured by assembling various subsystems containing their respective components as set forth in the scope of claims in the present application, so as to maintain predetermined mechanical accuracy, electrical accuracy, and optical accuracy. For ensuring these various accuracies, the following adjustments are carried out before and after the assembling: adjustment for achieving the optical accuracy for various optical systems; adjustment for achieving the mechanical accuracy for various mechanical systems; adjustment for achieving the electrical accuracy for various electrical systems. The assembling blocks from the various subsystems into the exposure apparatus include mechanical connections, wire connections of electric circuits, pipe connections of pneumatic circuits, etc. between the various subsystems. It is needless to mention that there are assembling blocks of the individual sub-systems, before the assembling blocks from the various sub-systems into the exposure apparatus. After completion of the assembling blocks from the various sub-systems into the exposure apparatus, overall adjustment is carried out to ensure various accuracies as the entire exposure apparatus. The manufacture of exposure apparatus is desirably performed in a clean room in which the temperature, cleanliness, etc. are controlled.

The exposure apparatus according to each of the above-described embodiments can be used to manufacture micro devices (semiconductor devices, imaging devices, liquid crystal display devices, thin-film magnetic heads, etc.) through a process of illuminating a mask M by the illumination optical system IL (illumination block) and exposing a photosensitive substrate (wafer) with a transfer pattern formed on the mask M, by the projection optical system PL (exposure block). An example of a method for obtaining semiconductor devices as micro devices by forming a predetermined circuit pattern in a wafer or the like as a photosensitive substrate by means of the exposure apparatus of the above embodiments will be described below with reference to the flowchart of FIG. 21.

Figure 21:
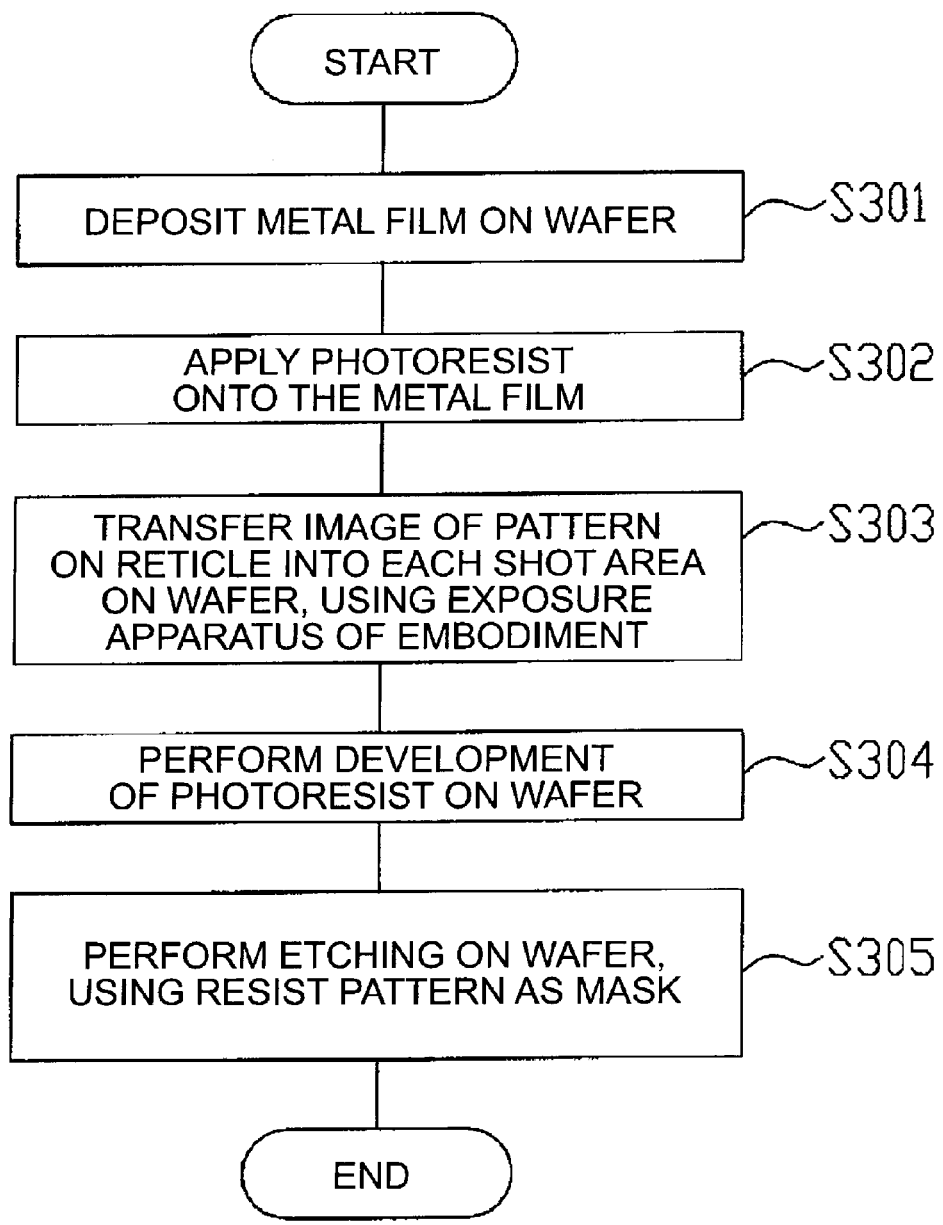
FIG. 21 is a flowchart showing a method of manufacturing semiconductor devices as micro devices according to an embodiment of the present invention.

The first block S301 in FIG. 21 is to deposit a metal film on each wafer in one lot. The next block S302 is to apply a photoresist onto the metal film on the wafer in the lot. Thereafter, the surface position of a wafer surface is detected and adjusted by the surface position detecting apparatus in the exposure apparatus according to the above embodiments. The subsequent block S303 is to use the exposure apparatus of the above embodiments to sequentially transfer an image of a pattern on a reticle (mask) into each shot area on the wafer in the lot through the projection optical system of the exposure apparatus. The subsequent block S304 is to perform development of the photoresist on the wafer in the lot and the next block S305 is to perform etching on the wafer in the lot, using the resist pattern as a mask, and thereby to form a circuit pattern corresponding to the pattern on the mask, in each shot area on each wafer.

Thereafter, devices such as semiconductor devices are manufactured through blocks including formation of circuit patterns in upper layers. The above-described semiconductor device manufacturing method permits us to obtain the good semiconductor devices because the exposure is performed by means of the exposure apparatus in which the surface position of the wafer or the like is accurately adjusted by the surface position detecting apparatus. The blocks S301-S305 are arranged to perform the respective blocks of deposition of metal on the wafer, application of the resist onto the metal film, exposure, development, and etching, but it is needless to mention that the process may be modified as follows: prior to these blocks, an oxide film of silicon is formed on the wafer, a resist is then applied onto the silicon oxide film, and thereafter the blocks of exposure, development, and etching are carried out.

Figure 22:
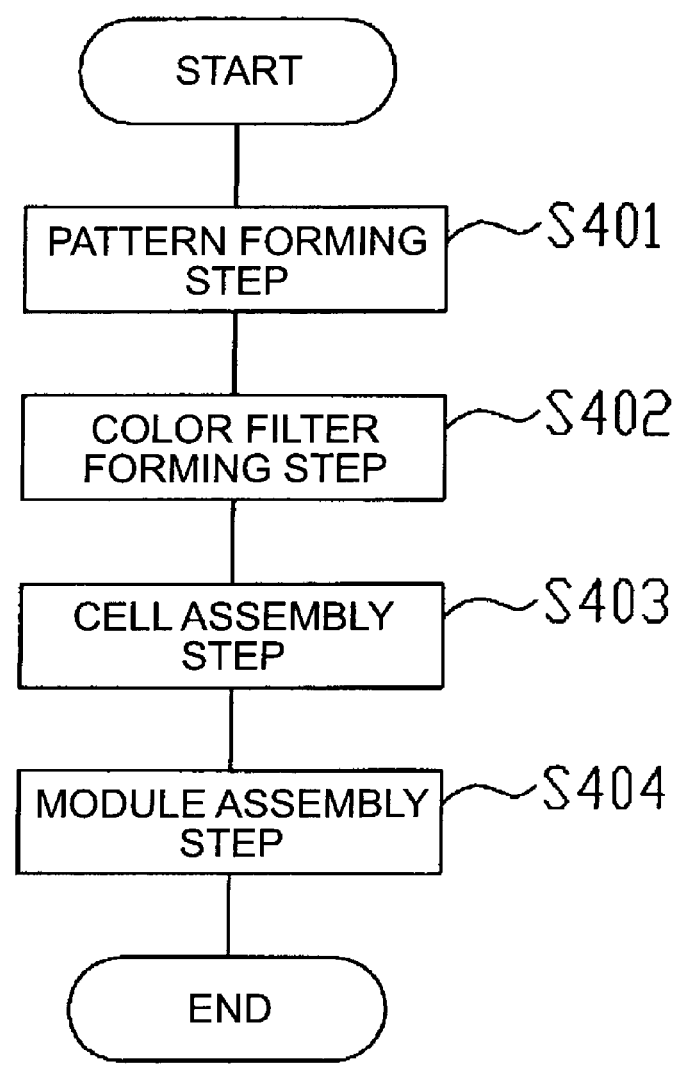
FIG. 22 is a flowchart showing a method of manufacturing a liquid crystal display device as a micro device according to an embodiment of the present invention.

The exposure apparatus of the above embodiments can also be used to manufacture a liquid crystal display device as a micro device by forming predetermined patterns (circuit patterns, electrode patterns, etc.) on plates (glass substrates). An example of a method in this case will be described below with reference to the flowchart of FIG. 22. First, the surface position of a plate surface is detected and adjusted by the surface position detecting apparatus in the exposure apparatus according to the above embodiments. Thereafter, in FIG. 22, a pattern forming block S401 is to execute a so-called photolithography block of transferring a pattern of a mask onto a photosensitive substrate (a glass substrate coated with a resist, or the like) by means of the exposure apparatus of the above embodiments. This photolithography block results in forming a predetermined pattern including a large number of electrodes and others on the photosensitive substrate. Thereafter, the exposed substrate is processed through each of blocks including a development block, an etching block, a resist removing block, etc. whereby the predetermined pattern is formed on the substrate, followed by the next color filter forming block S402.

The next color filter forming block S402 is to form a color filter in a structure in which a large number of sets of three dots corresponding to R (Red), G (Green), and B (Blue) are arrayed in a matrix pattern or in which sets of filters of three stripes of R, G, and B are arrayed in the horizontal scan line direction. After the color filter forming block S402, a cell assembling block S403 is executed. The cell assembling block S403 is to assemble a liquid crystal panel (liquid crystal cell) using the substrate with the predetermined pattern obtained in the pattern forming block S401, the color filter obtained in the color filter forming block S402, and others. In the cell assembling block S403, the liquid crystal panel (liquid crystal cell) is manufactured, for example, by pouring a liquid crystal into between the substrate with the predetermined pattern obtained in the pattern forming block S401 and the color filter obtained in the color filter forming block S402.

Since the surface position detecting apparatus of the above embodiments may comprises the detecting means to independently detect the measurement light traveling via the detection target surface and the reference light not traveling via the detection target surface, it is able to detect an error of the detection result of the measurement result from the detection result of the reference light at the same time as the surface position of the detection target surface is detected from the detection result of the measurement light. Therefore, it is able to quickly correct the detection result of the measurement light using the detection result of the reference light and to highly accurately detect the surface position of the detection target surface. Furthermore, with no need for detecting the detection error of the measurement light using another detection system, the apparatus is able to accurately detect the error of the detection result of the measurement light from the detection result of the reference light detected by the detecting means, via the optical members virtually identical to those passed by the measurement light, and thus to highly accurately detect the surface position of the detection target surface.

The exposure apparatus of the above embodiments may comprises the surface position detecting apparatus of the present invention and is thus able to quickly perform the correction for the detection result of the measurement light by the detecting means and to perform highly accurate exposure of the predetermined pattern on the substrate at high throughput.

The device manufacturing method of the above embodiments may comprise performing the exposure using the exposure apparatus of the present invention and thus makes it feasible to perform accurate exposure of the predetermined pattern on the photosensitive substrate and to manufacture good devices.

The subsequent module assembling block S404 is to attach various components such as electric circuits and backlights for display operation of the assembled liquid crystal panel (liquid crystal cell) to complete the liquid crystal display device. The above-described manufacturing method of the liquid crystal display device permits us to obtain the good liquid crystal display device because the exposure is performed by means of the exposure apparatus in which the surface position of the plate or the like is accurately adjusted by the surface position detecting apparatus.

It is noted that the embodiments explained above were described for easier understanding of the present invention but not for limiting the present invention. Therefore, each of the elements disclosed in the above embodiments is intended to embrace all the design changes and equivalents belonging to the technical scope of the present invention. Each of the constituent elements and others in the above embodiments can be used, for example, in any combination thereof.

The invention is not limited to the foregoing embodiments but various changes and modifications of its components may be made without departing from the scope of the present invention. Also, the components disclosed in the embodiments may be assembled in any combination for embodying the present invention. For example, some of the components may be omitted from all components disclosed in the embodiments. Further, components in different embodiments may be appropriately combined.

The disclosure of the present specification is associated with the subject matter included in Japanese Patent Application No. 2006-193600 filed on Jul. 14, 2006, and the disclosure thereof is explicitly incorporated herein by reference in its entirety.

The invention claimed is:

1. A surface position detecting apparatus, comprising:
a light-sending optical system including a first lens system, the light-sending optical system guiding light to a detection target surface via the first lens system;
a light-receiving optical system including a second lens system, the light-receiving optical system guiding the light reflected by the detection target surface to a light-receiving surface via the second lens system;
a detector which detects the light via the light-receiving surface;
a splitter arranged on an optical path between the first lens system and the detection target surface, which splits the light emerged from the first lens system into a first light and a second light; and
a combiner arranged in an optical path between the detection target surface and the second lens system, which combines the first light reflected by the detection target surface with the second light which does not pass via the detection target surface, to orient the combined light toward the light receiving surface;
wherein the first light and the second light are guided from the splitter to the combiner without passing through any lens system,
wherein the detector detects the first light and the second light via the light receiving surface, to provide information regarding a surface position of the detection target surface on the basis of detection results of the first light and the second light.

2. The surface position detecting apparatus according to claim 1, further comprising:
at least one optical member arranged on an optical path of the second light, which inverts an image of a standard object to be formed on the light-receiving surface.

3. The surface position detecting apparatus according to claim 2,
wherein a difference between a number of reflecting surfaces arranged in the optical path of the first light and a number of reflecting surfaces arranged in the optical path of the second light is an odd number.

4. The surface position detecting apparatus according to claim 2,
wherein the at least one optical member which inverts the image of the standard object comprises a relay optical system with an odd number of imaging times.

5. The surface position detecting apparatus according to claim 1,
wherein the first light and the second light are guided via the second lens system to the light-receiving surface of the detector.

6. The surface position detecting apparatus according to claim 1, further comprising:
an adjustor which adjusts the surface position of the detection target surface on the basis of the information provided by the detector,
wherein the detector corrects a detection result of the measurement light, based on a detection result of the reference light, and
wherein the adjustor adjusts a position of the detection target surface on the basis of the detection result corrected by the detector.

7. An exposure apparatus to transfer a predetermined pattern on a photosensitive substrate, comprising:
the surface position detecting apparatus according to claim 1, for detecting a position of a surface of the photosensitive substrate;
a moving device which moves the photosensitive substrate on the basis of a detection result provided by the surface position detecting apparatus; and
a projection optical system which projects the predetermined pattern onto the photosensitive substrate moved by the moving device.

8. The exposure apparatus according to claim 7,
wherein in transferring the predetermined pattern onto the photosensitive substrate, a liquid is supplied to between an optical member on the photosensitive substrate side forming the projection optical system, and the photosensitive substrate.

9. A device manufacturing method comprising:
detecting a surface position of a photosensitive substrate by using the surface position detecting apparatus according to claim 1;
moving the photosensitive substrate based on the detection result provided by the surface position detecting apparatus;
transferring a predetermined pattern onto a photosensitive substrate moved on the basis of the detection result; and
developing the photosensitive substrate on which the predetermined pattern has been transferred in the transferring of the predetermined pattern.

10. A surface position detecting apparatus comprising:
a light-sending optical system including a first lens system, the light-sending optical system guiding light from a standard object to a detection target surface via the first lens systems;
a light-receiving optical system including a second lens system, the light-receiving optical system guiding the light reflected by the detection target surface to a light-receiving surface via the second lens system;
a detector which detects the light via the light-receiving surface;
a first optical path deflector arranged on an optical path of the light between the first lens system and the detection target surface, the first optical deflector deflecting first and second optical paths to guide a first light from a first region of the standard object to the first optical path which is via the detection target surface and guiding a second light from a second region of the standard object to the second optical path; and
a second optical path deflector arranged on an optical path of the light between the detection target surface and the second lens system, the second optical path deflector deflecting at least one of the first optical path extending from the detection target surface to the second lens system to guide the first light to a third region of the light-receiving surface via the second lens system and guide the second light to a fourth region of the light receiving surface through the second lens system,
wherein the first light and the second light are guided from the first optical path deflector to the second optical path deflector without passing through any lens system, wherein the detector detects the first light which is via the third region and the second light which is via the fourth region to provide information regarding a surface position of the detection target surface on the basis of a detection result of the first and second light.

11. The surface position detecting apparatus according to claim 10, further comprising:
   at least one optical member arranged on an optical path of the second light, which inverts an image of the standard object to be formed on the light-receiving surface.

12. The surface position detecting apparatus according to claim 11, wherein a difference between a number of reflecting surfaces arranged in the optical path of the first light and a number of reflecting surfaces arranged in the optical path of the second light is an odd number.

13. The surface position detecting apparatus according to claim 11,
   wherein said at least one optical member which inverts the image of the standard object comprises a relay optical system with an odd number of imaging times.

14. The surface position detecting apparatus according to claim 10, further comprising:
   an adjustor which adjusts the surface position of the detection target surface on the basis of the information provided by the detector,
   wherein the detector corrects a detection result of the measurement light, based on a detection result of the reference light, and
   wherein the adjustor adjusts a position of the detection target surface on the basis of the detection result corrected by the detector.

15. An exposure apparatus to transfer a predetermined pattern on a photosensitive substrate, comprising:
   the surface position detecting apparatus according to claim 10, for detecting a position of a surface of the photosensitive substrate;
   a moving device which moves the photosensitive substrate on the basis of a detection result provided by the surface position detecting apparatus; and
   a projection optical system which projects the predetermined pattern onto the photosensitive substrate moved by the moving device.

* * * * *